US012749241B2

(12) United States Patent
Zhao et al.

(10) Patent No.: US 12,749,241 B2
(45) Date of Patent: Sep. 29, 2026

(54) ACCELERATED SIMULTANEOUS MULTISLICE IMAGING VIA LINEAR PHASE MODULATED EXTENDED FIELD OF VIEW (SMILE)

(71) Applicant: The Board of Trustees of the Leland Stanford Junior University, Stanford, CA (US)

(72) Inventors: Shen Zhao, Sunnyvale, CA (US); Michael Salerno, Belmont, CA (US); Junyu Wang, Menlo Park, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 345 days.

(21) Appl. No.: 18/420,104

(22) Filed: Jan. 23, 2024

(65) Prior Publication Data

US 2024/0249449 A1 Jul. 25, 2024

Related U.S. Application Data

(60) Provisional application No. 63/440,488, filed on Jan. 23, 2023.

(51) Int. Cl.
*G01R 33/483* (2006.01)
*G01R 33/561* (2006.01)
*G06T 12/00* (2026.01)

(52) U.S. Cl.
CPC .......... *G06T 12/00* (2026.01); *G01R 33/4835* (2013.01); *G01R 33/5611* (2013.01)

(58) Field of Classification Search
CPC ................ G06T 12/00; G01R 33/4835; G01R 33/5611
See application file for complete search history.

(56) References Cited

U.S. PATENT DOCUMENTS

| | | | | |
|---|---|---|---|---|
| 11,062,488 | B2 * | 7/2021 | Arberet | G01R 33/5608 |
| 2011/0254548 | A1 * | 10/2011 | Setsompop | G01R 33/4835 324/309 |
| 2018/0306880 | A1 * | 10/2018 | Salerno | G01R 33/4835 |
| 2020/0088822 | A1 * | 3/2020 | Jurrissen | G01R 33/4835 |
| 2020/0294287 | A1 * | 9/2020 | Schlemper | A61B 5/055 |
| 2022/0244333 | A1 * | 8/2022 | Zhao | G01R 33/543 |
| 2022/0409084 | A1 * | 12/2022 | Lyu | G01R 33/5617 |

OTHER PUBLICATIONS

Bo Zhao et al.: "Improved Magnetic Resonance Fingerprinting Reconstruction with Low-Rank and Subspace Modeling"; Feb. 2018, Magn Reson Med; 79(2): 933-942; 19 pages (Year: 2018).*

(Continued)

*Primary Examiner* — Siamak Harandi
(74) *Attorney, Agent, or Firm* — LUMEN PATENT FIRM

(57) ABSTRACT

A method for simultaneous multislice (SMS) magnetic resonance imaging (MRI) acquisition and image reconstruction includes a) using an MRI apparatus, simultaneously i) exciting multiple imaging slices with a phase modulation strategy used to distribute the image content over an extended phase-encoding field of view (FOV), and ii) acquiring data from the multiple slices using a sampling strategy comprising a k-space under-sampling pattern over an extended phase-encoding FOV k-space matrix; and b) reconstructing images comprising the multiple slices over the extended phase-encoded FOV using an image reconstruction technique.

13 Claims, 19 Drawing Sheets

(56) References Cited

OTHER PUBLICATIONS

Glover, Gary H. "Phase-offset multiplanar (POMP) vol. imaging: a new technique." Journal of Magnetic Resonance Imaging 1.4 (1991): 457-461.
Breuer, Felix A., et al. "Controlled aliasing in parallel imaging results in higher acceleration (CAIPIRINHA) for multislice imaging." Magnetic Resonance in Medicine, 53.3 (2005): 684-691.
Blaimer, Martin, et al. "Accelerated volumetric MRI with a SENSE/GRAPPA combination." Journal of Magnetic Resonance Imaging, 24.2 (2006): 444-450.
Setsompop, Kawin, et al. "Blipped-controlled aliasing in parallel imaging for simultaneous multislice echo planar imaging with reduced g-factor penalty." Magnetic resonance in medicine, 67.5 (2012): 1210-1224.
Cauley, Stephen F., et al. "Interslice leakage artifact reduction technique for simultaneous multislice acquisitions." Magnetic resonance in medicine, 72.1 (2014): 93-102.
Demirel, Omer Burak, et al. "Improved simultaneous multislice cardiac MRI using readout concatenated k-space Spirit (Rock-Spirit)." Magnetic resonance in medicine, 85.6 (2021): 3036-3048.
Chen, Chong, et al. "OCMR (v1. 0) -- Open-Access Multi-Coil k-Space Dataset for Cardiovascular Magnetic Resonance Imaging." arXiv preprint arXiv:2008.03410 (2020).
Rich, Adam, et al. "CArtesian sampling with Variable density and Adjustable temporal resolution (CAVA)." Magnetic resonance in medicine, 83.6 (2020): 2015-2025.
Zhao, Shen, Lee C. Potter, and Rizwan Ahmad. "High-dimensional fast convolutional framework (HICU) for calibrationless MRI." Magnetic Resonance in Medicine, 86.3 (2021): 1212-1225.

* cited by examiner 400
402
404
406
Fully sampled 2D slice k-space
Fully sampled 3D k-space
Superimposed 2D slice k-space
Undersampled 3D k-space
Superimposing
(Split) Slice-GRAPPA
Sampling
3D Kernel
Zero Filling
Extracting Slice-GRAPPA Split Slice-GRAPPA

*Fig. 13A*
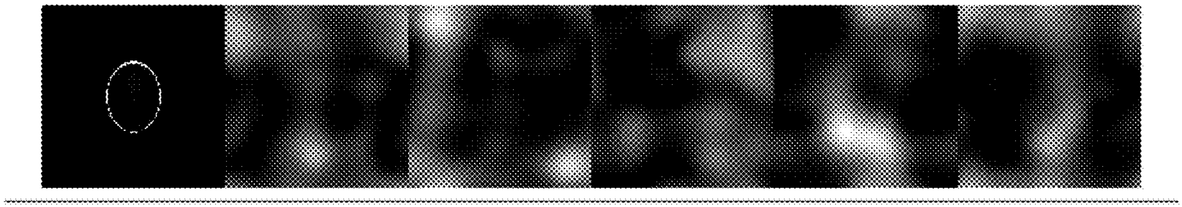
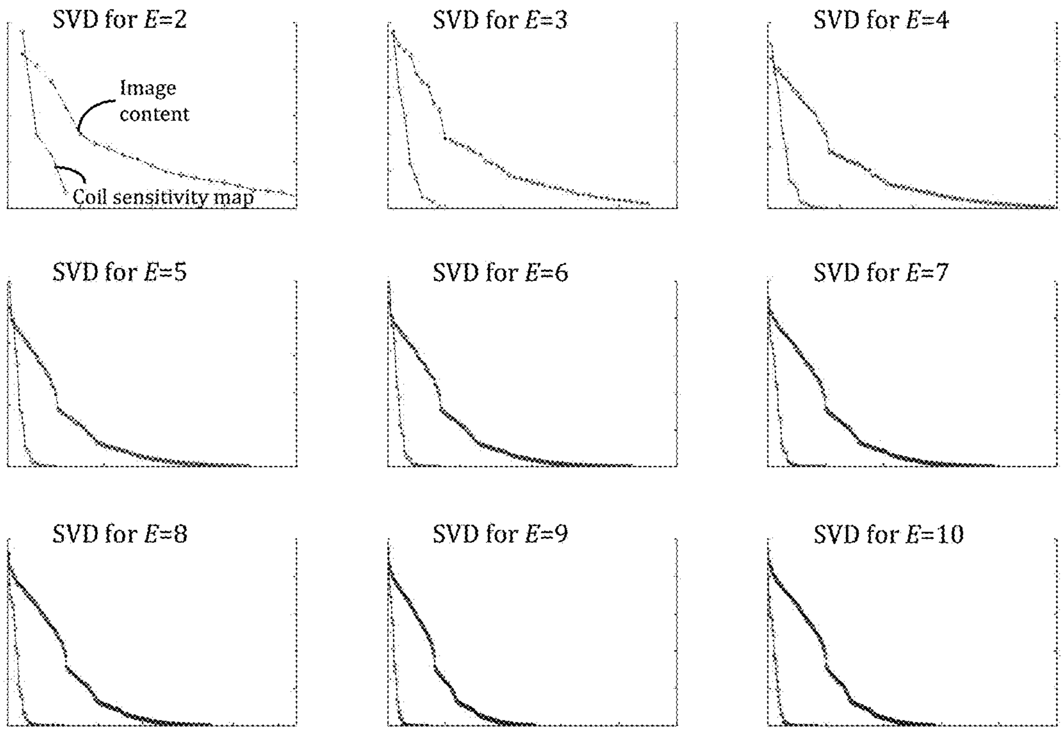
*Fig. 13B*

ACCELERATED SIMULTANEOUS MULTISLICE IMAGING VIA LINEAR PHASE MODULATED EXTENDED FIELD OF VIEW (SMILE)

CROSS-REFERENCE TO RELATED APPLICATIONS

This application claims priority from U.S. Provisional Patent Application 63/440,488 filed Jan. 23, 2023, which is incorporated herein by reference.

STATEMENT REGARDING FEDERALLY SPONSORED RESEARCH OR DEVELOPMENT

This invention was made with Government support under contract HL131919 awarded by the National Institutes of Health. The Government has certain rights in the invention.

FIELD OF THE INVENTION

The present invention relates generally to magnetic resonance imaging. More specifically, it relates to improved simultaneous multislice (SMS) acquisition and reconstruction techniques.

BACKGROUND OF THE INVENTION

In the field of magnetic resonance imaging, various simultaneous multislice (SMS) acquisition and reconstruction techniques have been proposed to improve acquisition efficiency in combination with parallel imaging, including phase offset multiplanar (POMP) volume imaging, SMS (without phase modulation), and Controlled Aliasing in Parallel Imaging Results in Higher Acceleration (CAIPIRINHA). Several reconstruction algorithms have been developed to improve the image quality, including SENSE-GRAPPA, Slice-GRAPPA (SG), Split Slice-GRAPPA (SPSG), and ROCK-SPIRiT[MS1] (RS).

In contrast to acquiring multiple slices sequentially, Simultaneous Multi-Slice (SMS) enjoys the SNR efficiency of volumetric imaging and benefits time-critical applications, including cardiac imaging, abdominal imaging and functional magnetic resonance imaging. Various SMS acquisition and reconstruction techniques have been proposed, including multiple line scan techniques, selective multifrequency RF pulses, SIMA/Hadamard, POMP, SMS (w/o phase modulation), and CAIPIRINHA. Dedicated reconstruction algorithms tailored for SMS imaging include SENSE/GRAPPA, Slice-GRAPPA (SG), Split Slice-GRAPPA (SPSG), and ROCK-SPIRiT. Despite these advances, the challenge of maintaining image quality at high acceleration rates, especially in the context of slice leakage, remains a significant challenge.

BRIEF SUMMARY OF THE INVENTION

In this work, we extend POMP and develop a new efficient accelerated SMS acquisition technique: Simultaneous Multislice Imaging via Linear phase modulated Extended field of view (SMILE).

SMILE transforms the SMS problem into a 2D imaging task and enables direct implementation of 2D non-SMS-only reconstruction algorithms. SMILE increases the sampling degree of freedom by a factor of the number of slices and could theoretically avoid the significant "slice-leakage" issue.

SMILE can be combined with almost all MRI acquisitions to increase acquisition efficiency and sampling degrees of freedom.

More generally, the invention provides a method for simultaneous multislice (SMS) magnetic resonance imaging (MRI) acquisition and image reconstruction involving the following features: a) Excitation phase modulation to shift slices over an extended Field of View. b) Arbitrary (Cartesian or possibly non-cartesian) k-space undersampling. c) Image reconstruction of the data corresponding to the extended Field of View.

This concise simultaneous multislice (SMS) MRI acquisition and reconstruction framework can achieve full sampling degrees of freedom and avoid the long-standing issue of slice leakage.

This simultaneous multi-slice imaging via linear phase modulated extended field of view (SMILE) method treats SMS acquisition and reconstruction within an extended field of view framework, increasing phase encoding (PE) undersampling degree of freedom by a factor of the number of slices, and enabling general parallel imaging reconstruction.

Experimental results in a retrospectively downsampled T2 weighted brain study, a retrospectively downsampled cine study, and a prospectively undersampled in-vivo perfusion study validate the improved performance of SMILE and the ability to reconstruct without leakage.

These experimental results validate the improved performance of SMILE compared to existing SMS acquisition and reconstruction framework. SMILE as an infrastructural framework can be combined with many imaging tasks and has potentially broad applicability in many MRI areas.

In one aspect, the invention provides a method for simultaneous multislice (SMS) magnetic resonance imaging (MRI) acquisition and image reconstruction comprising: a) using an MRI apparatus, simultaneously i) exciting multiple imaging slices with a phase modulation strategy used to distribute the image content over an extended phase-encoding field of view (FOV), and ii) acquiring data from the multiple slices using a sampling strategy comprising a k-space under-sampling pattern over an extended phase-encoding FOV k-space matrix; and b) reconstructing images comprising the multiple slices over the extended phase-encoded FOV using an image reconstruction technique.

In some implementations, the sampling strategy uses Cartesian variable density and adjustable temporal resolution (CAVA) as a spatial-temporal k-space sampling strategy. In some implementations, the sampling strategy uses a uniform under-sampling pattern as a k-space sampling strategy. In some implementations, the sampling strategy uses a variable density Poisson disk strategy or other variable density strategy is used as a spatial-temporal sampling strategy. In some implementations, excitation phase modulation is used to shift slices uniformly or non-uniformly over an extended FOV.

In some implementations, an optimized phase modulation is applied to each line of k-space data to maximize a metric over the extended phase-encoding FOV reconstruction. In some implementations, the extended phase-encoding FOV is a non-integer multiple of the number of excited slices.

In some implementations, the image reconstruction technique is high-dimensional fast convolutional framework (HICU) image reconstruction. In some implementations, the image reconstruction technique is performed using parallel imaging reconstruction. In some implementations, the image reconstruction technique is performed using a compressed-sensing-based reconstruction. In some implementations, the image reconstruction technique is performed using a machine-learning-based reconstruction. In some implementations, the image reconstruction technique is performed using a low-rank subspace reconstruction.

In another aspect, the invention provides a method for magnetic resonance imaging comprising performing with an MRI apparatus simultaneous multislice (SMS) acquisition and image reconstruction, characterized in that: the SMS acquisition uses Cartesian sampling with variable density and adjustable temporal resolution (CAVA) spatiotemporal sampling and samples in a superposition of multiple linear-phase-modulated k-space with an extended field of view, thereby avoiding abrupt image content change; and the image reconstruction is high-dimensional fast convolutional framework (HICU) image reconstruction.

Figure 6:
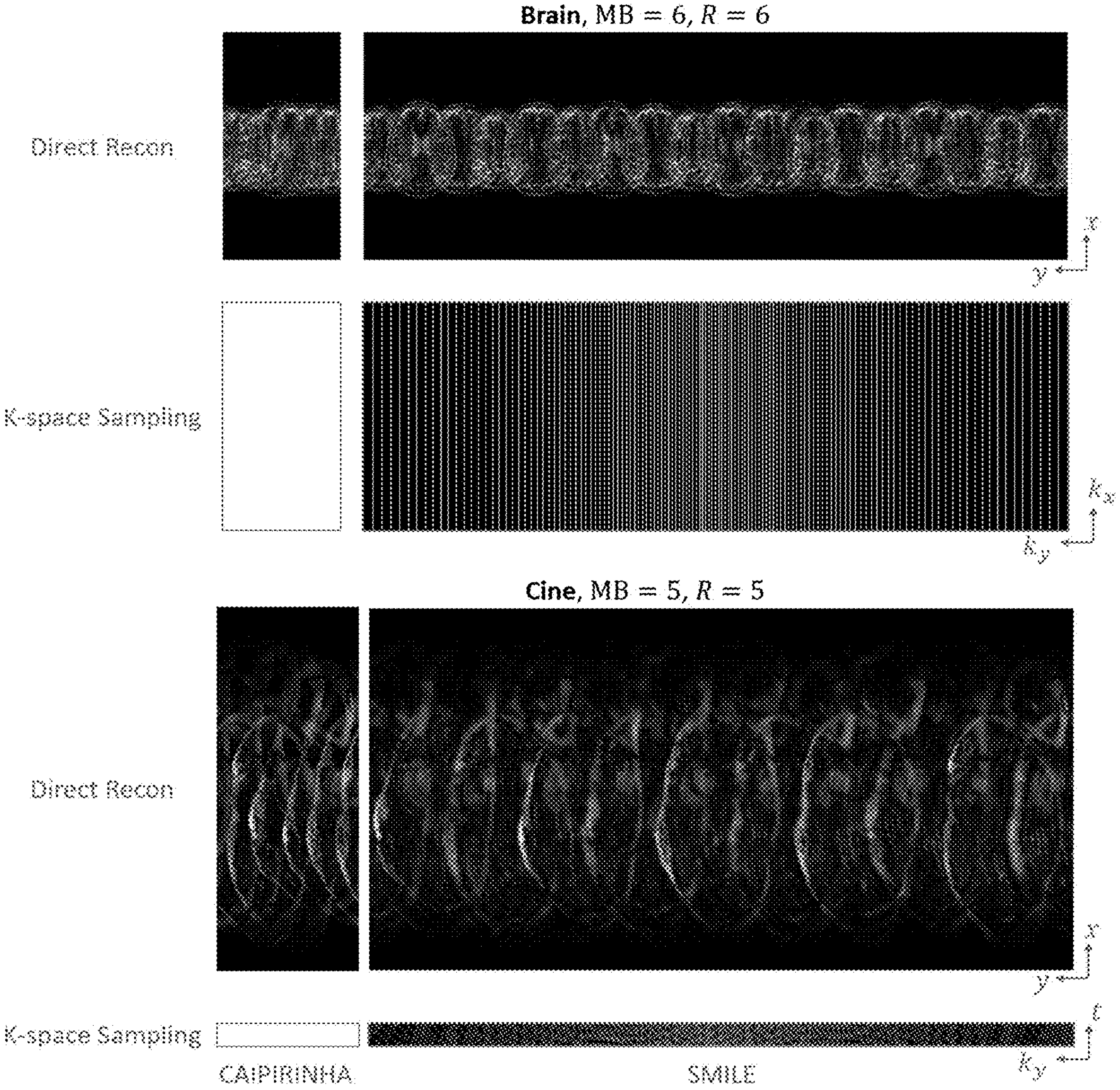
Figure 7A:
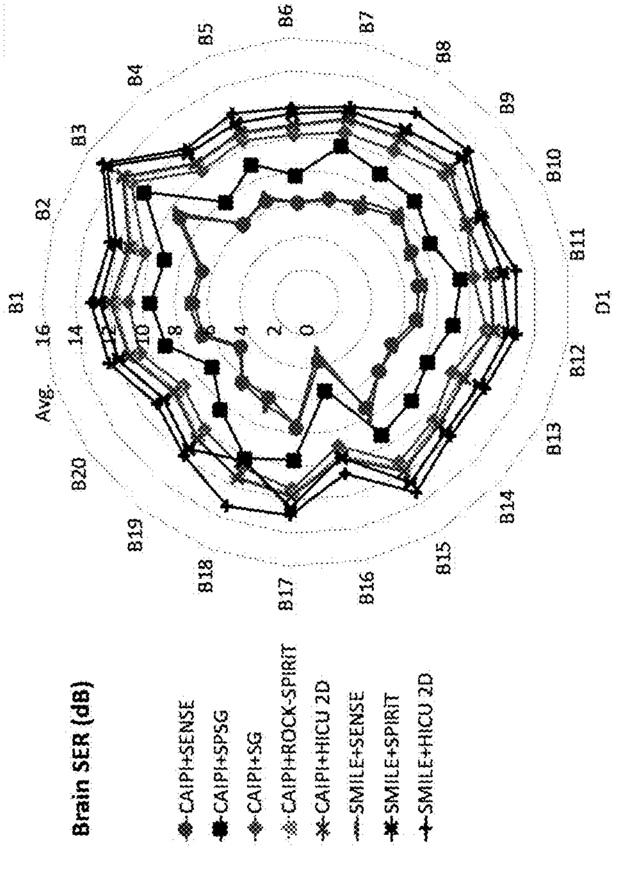
Figure 7B:
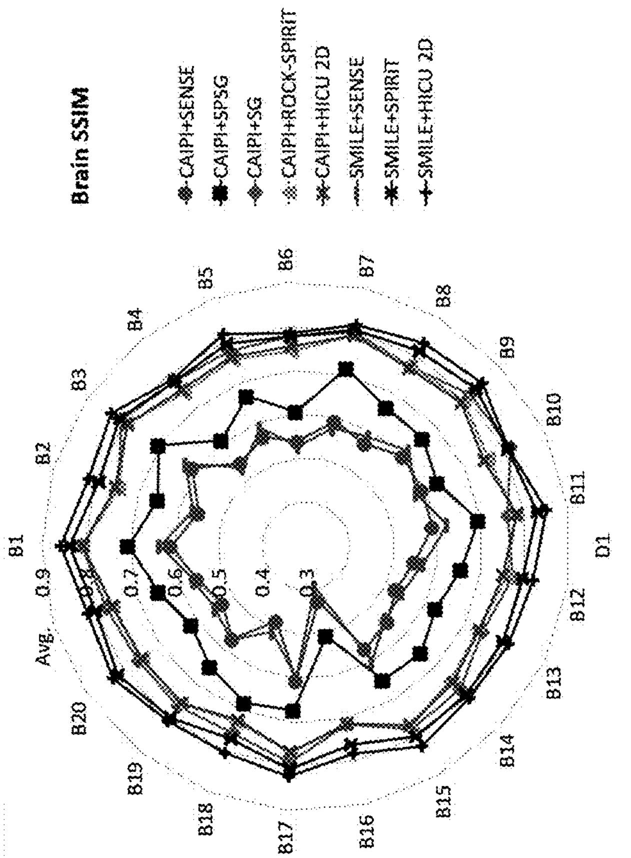
Figure 7D:
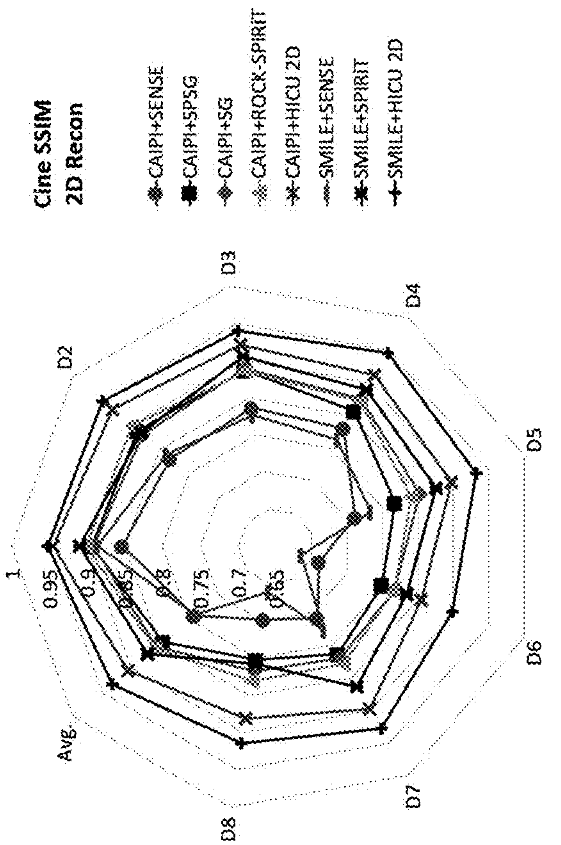
Figure 7C:
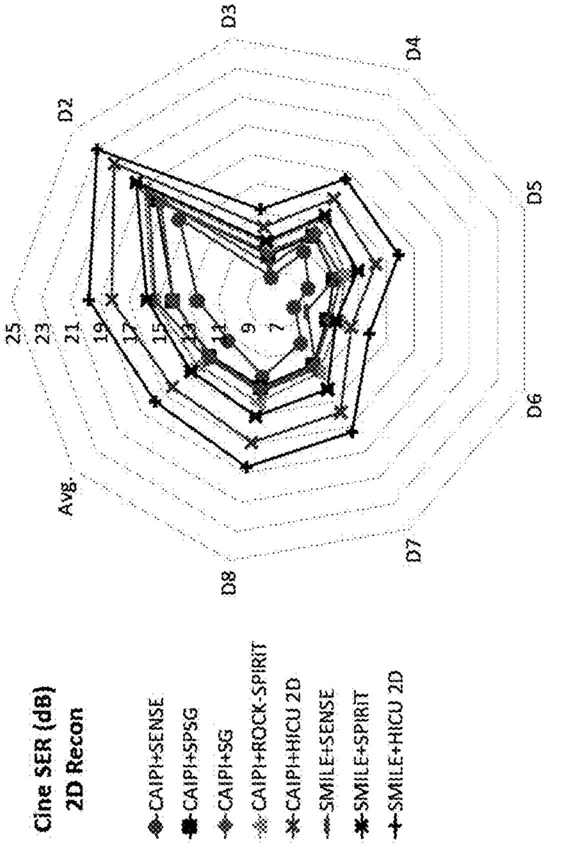
Figure 7F:
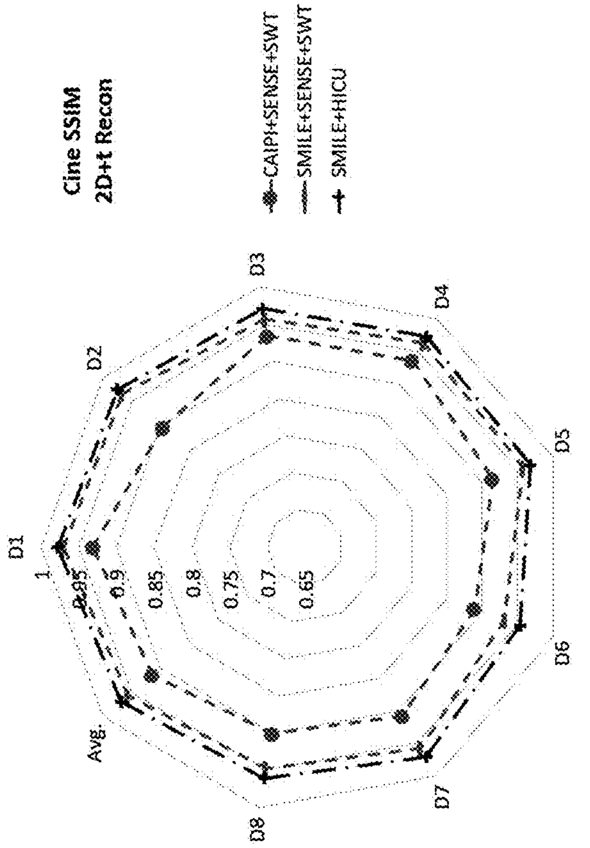
Figure 7E:
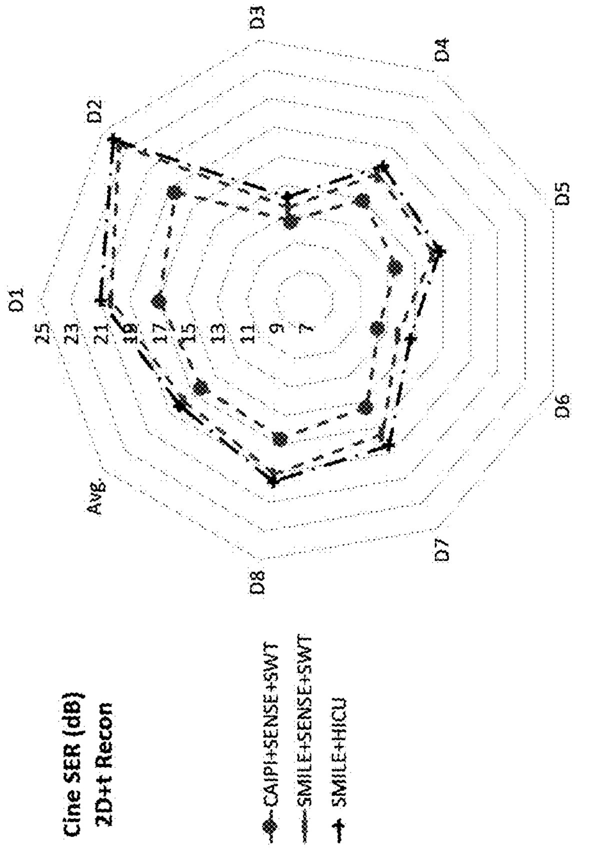
Figure 8A:
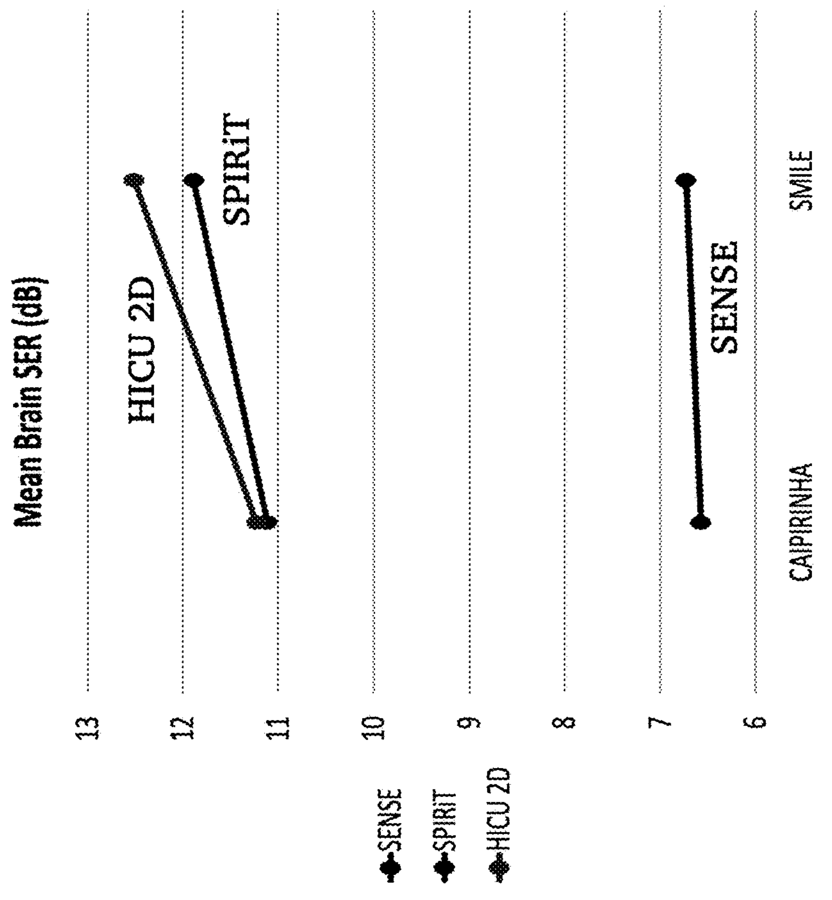
Figure 8B:
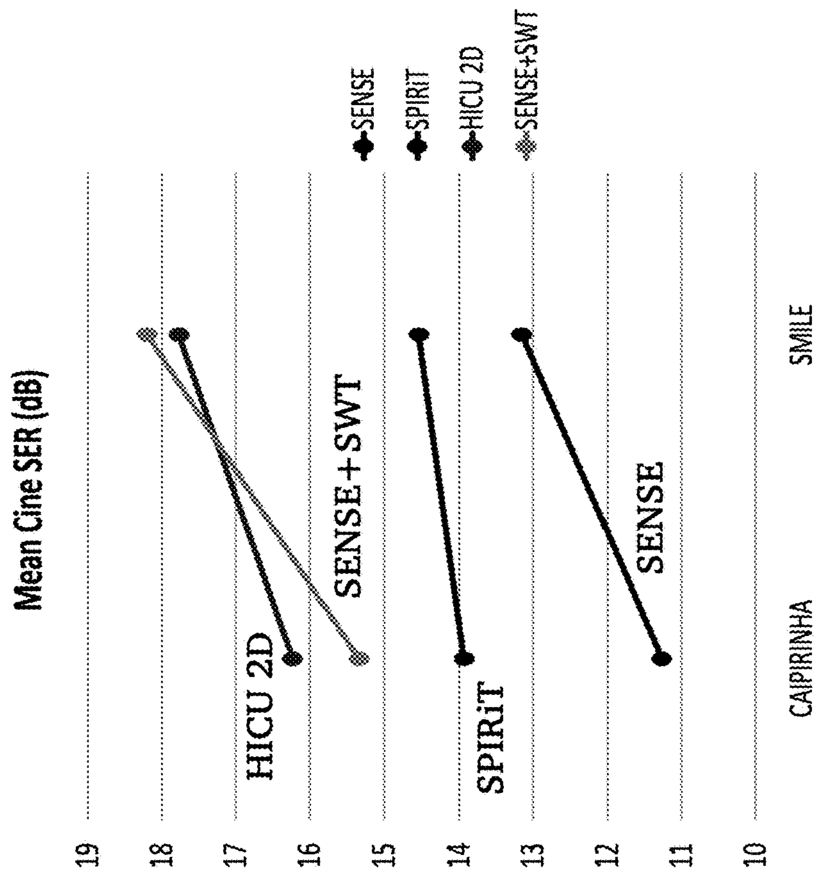
Figure 8D:
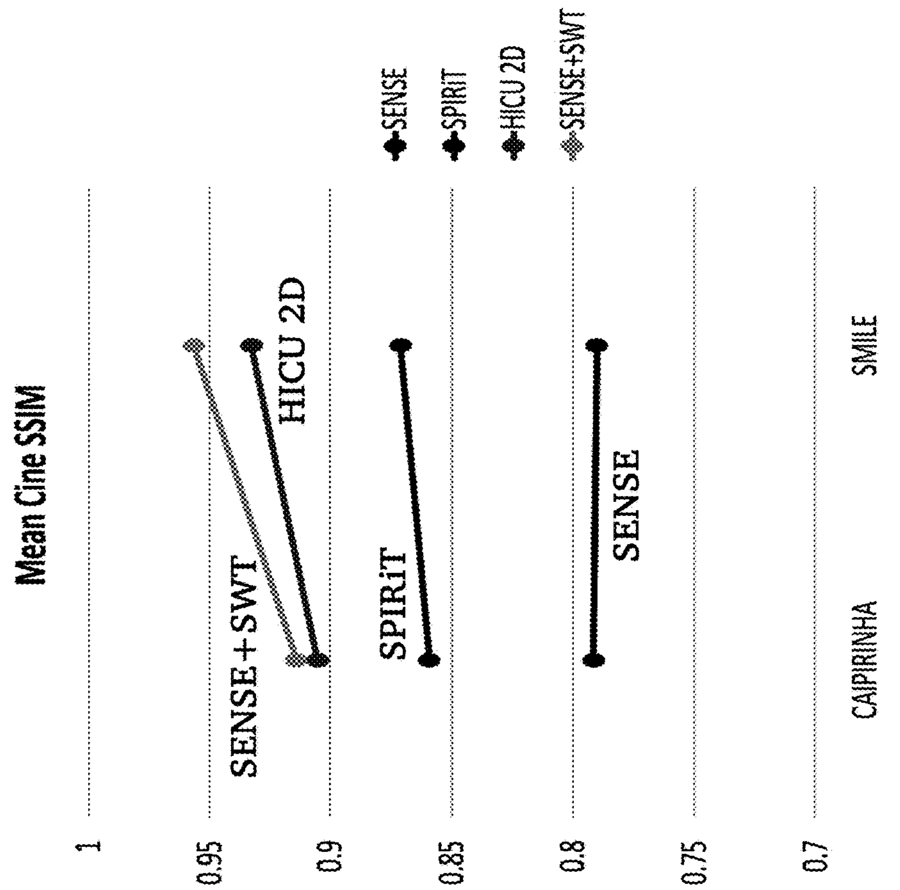
Figure 8C:
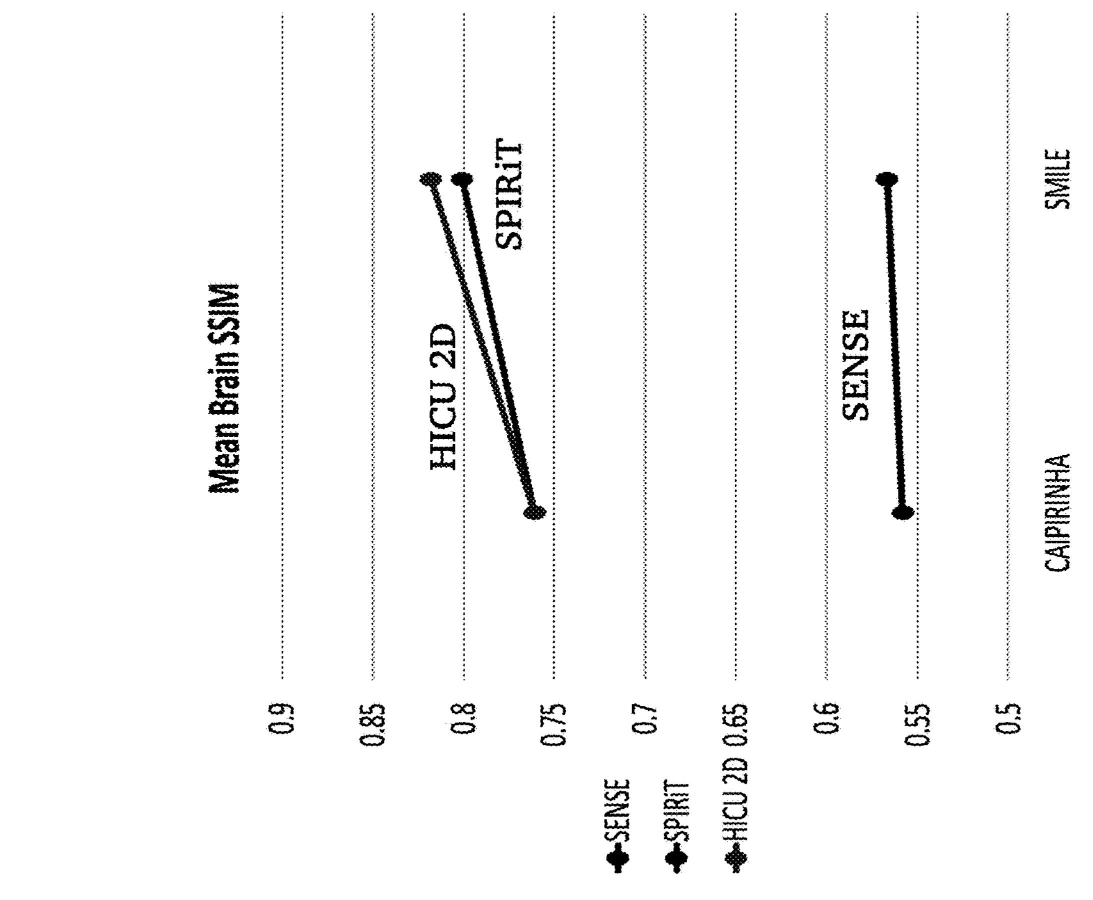

For all acquisitions, net R=5, except for separate calibration data. CAIPIRINHA employed full in-plane sampling, SMILE adopted CAVA, as shown in FIG. 6. The figure shows using B1 and D1 frame 1 to illustrate the acquisition difference between CAIPIRINHA (left image in each row) and SMILE (right image in each row). Net acceleration rates are the same for CAIPIRINHA and SMILE. There is no in-plane downsampling for CAIPIRINHA, while SMILE adopts the CAVA sampling pattern. CAIPIRINHA shifts and overlaps the slice images, while SMILE, through variable density sampling, aliases the slice images in the extended FOV. Direct Recon and K-space Sampling are shown in subsequent rows for Brain (top two rows) and Cine (bottom two rows).

FIG. 6 are images illustrating the acquisition difference between CAIPIRINHA (left image in each row) and SMILE (right image in each row), where the top two rows show Direct Recon and K-space Sampling for Brain and the bottom two rows show Direct Recon and K-space Sampling for Cine.

FIGS. 7A-7F are radar charts of the reconstruction quality in terms of SER and SSIM for retrospectively downsampled brain and cine studies with different acquisition and reconstruction combinations.

FIGS. 8A-8D are graphs comparing CAIPIRINHA and SMILE values of the mean Brain SER (FIG. 8A), mean Cine SER (FIG. 8B), mean Brain SSIM (FIG. 8C), and mean Cine SSIM (FIG. 8D) for various reconstruction methods.

Figure 9:
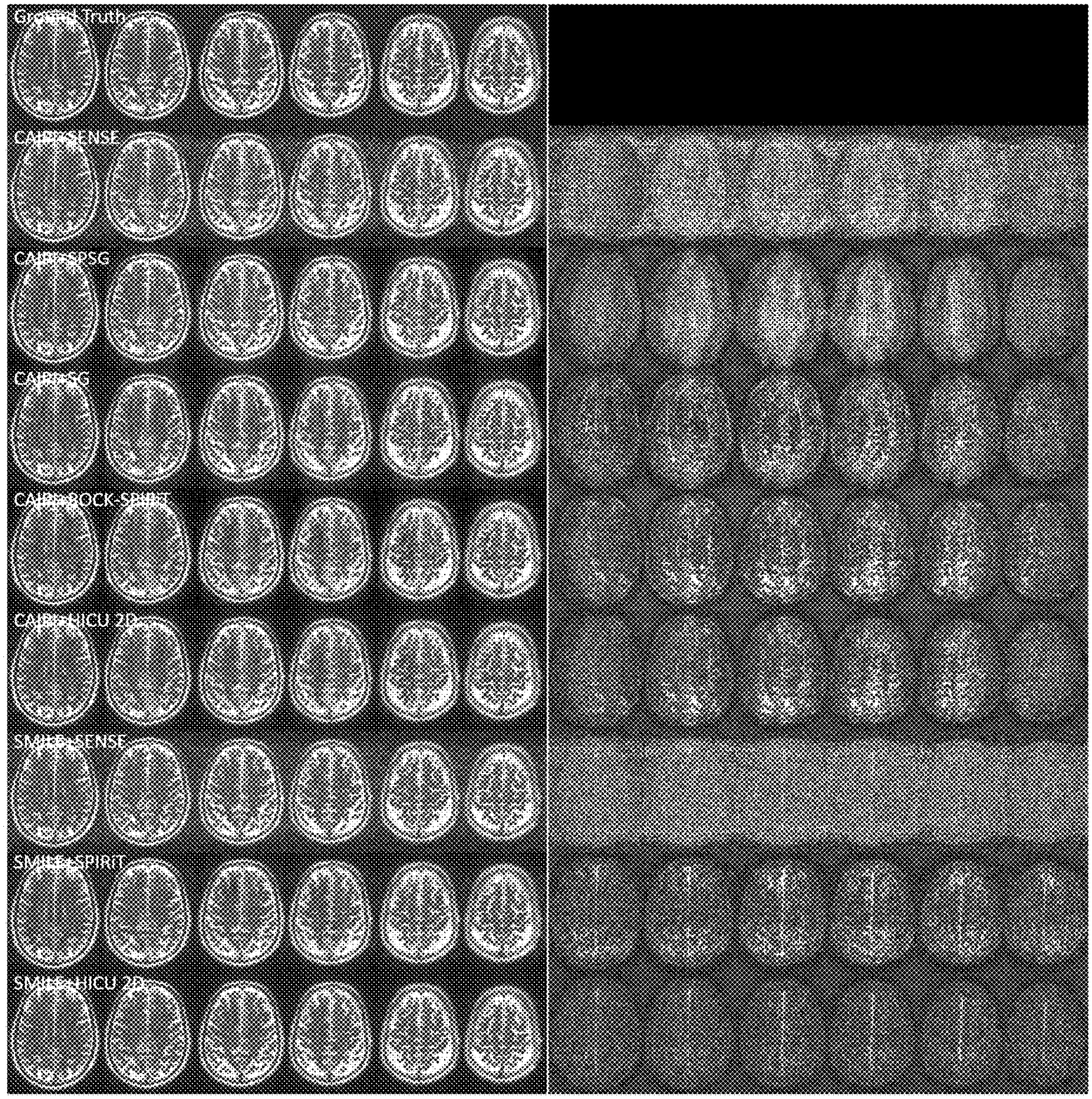

FIG. 9 is a grid comparing brain study image reconstruction results produced by various methods, where the top row shows ground truth images, and the following rows show, respectively, CAIPIRINHA+SENSE, CAIPIRINHA+SPSG, CAIPIRINHA+SG, CAIPIRINHA+ROCK-SPIRiT, CAIPIRINHA+HICU 2D, SMILE+SENSE, and SMILE+SPIRiT. The columns show difference vertical slices (left columns) and corresponding error maps (right columns).

Figure 10:
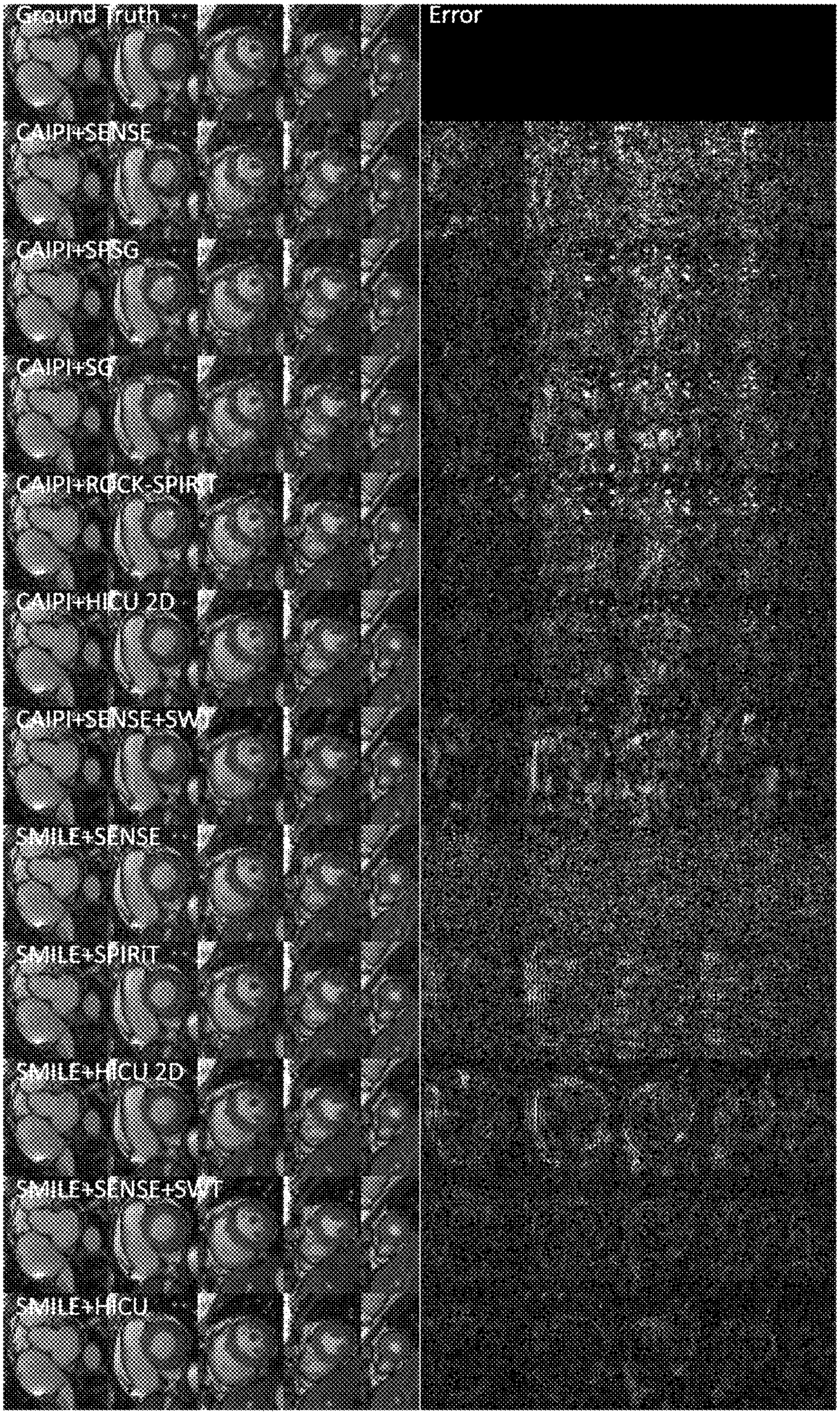

FIG. 10 is a grid comparing cine study image reconstruction results produced by various methods, where the top row shows ground truth images, and the following rows show, respectively, CAIPIRINHA+SENSE, CAIPIRINHA+SPSG, CAIPIRINHA+SG, CAIPIRINHA+ROCK-SPIRiT, CAIPIRINHA+HICU 2D, CAIPIRINHA+SENSE+SWT, SMILE+SENSE, SMILE+SPIRiT, SMILE+HICU 2D, SMILE+SENSE+SWT, and SMILE+HICU. The columns show different vertical slices (left columns) and corresponding error maps (right columns).

Figure 11:
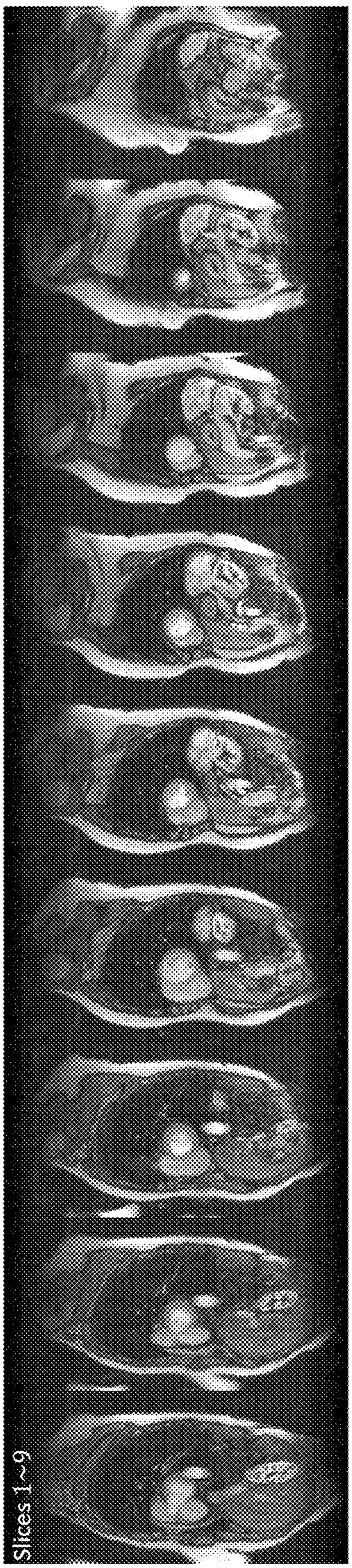

FIG. 11 shows slices of a representative frame of a prospectively undersampled SMILE perfusion study.

Figure 12A:
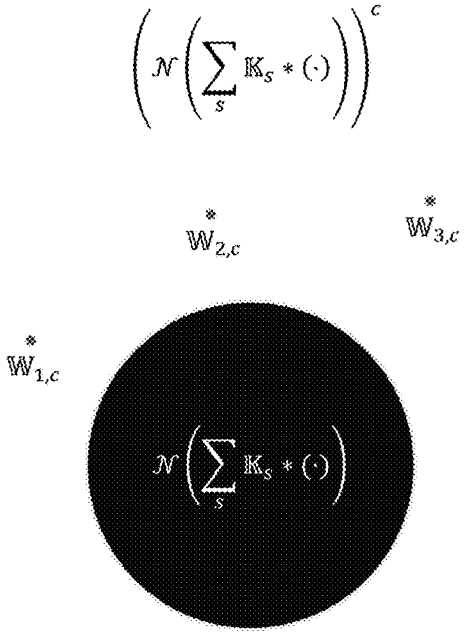
Figure 12B:
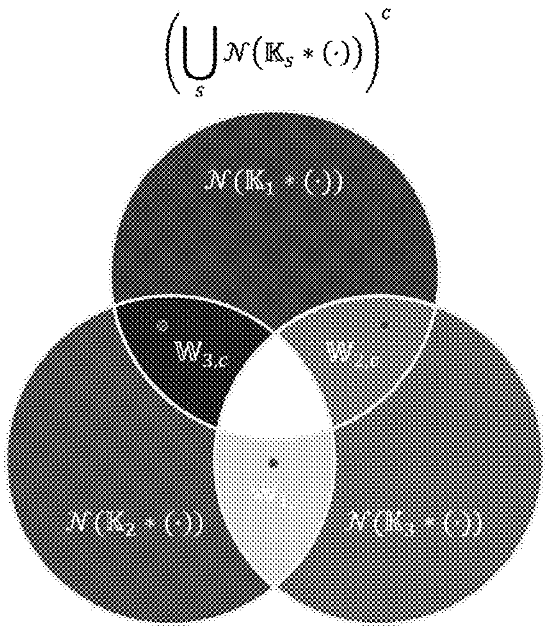

FIGS. 12A-12B are Venn diagrams showing different assumptions of Slice-GRAPPA (SG) and Split Slice-GRAPPA (SPSG) illustrated using three slices.

FIG. 13A are images of a Simulated Shepp-Logan phantom and five randomly generated coil sensitivity maps.

FIG. 13B are graphs for various different kernel sizes showing SVD of image content and coil sensitivity map.

Figure 14:
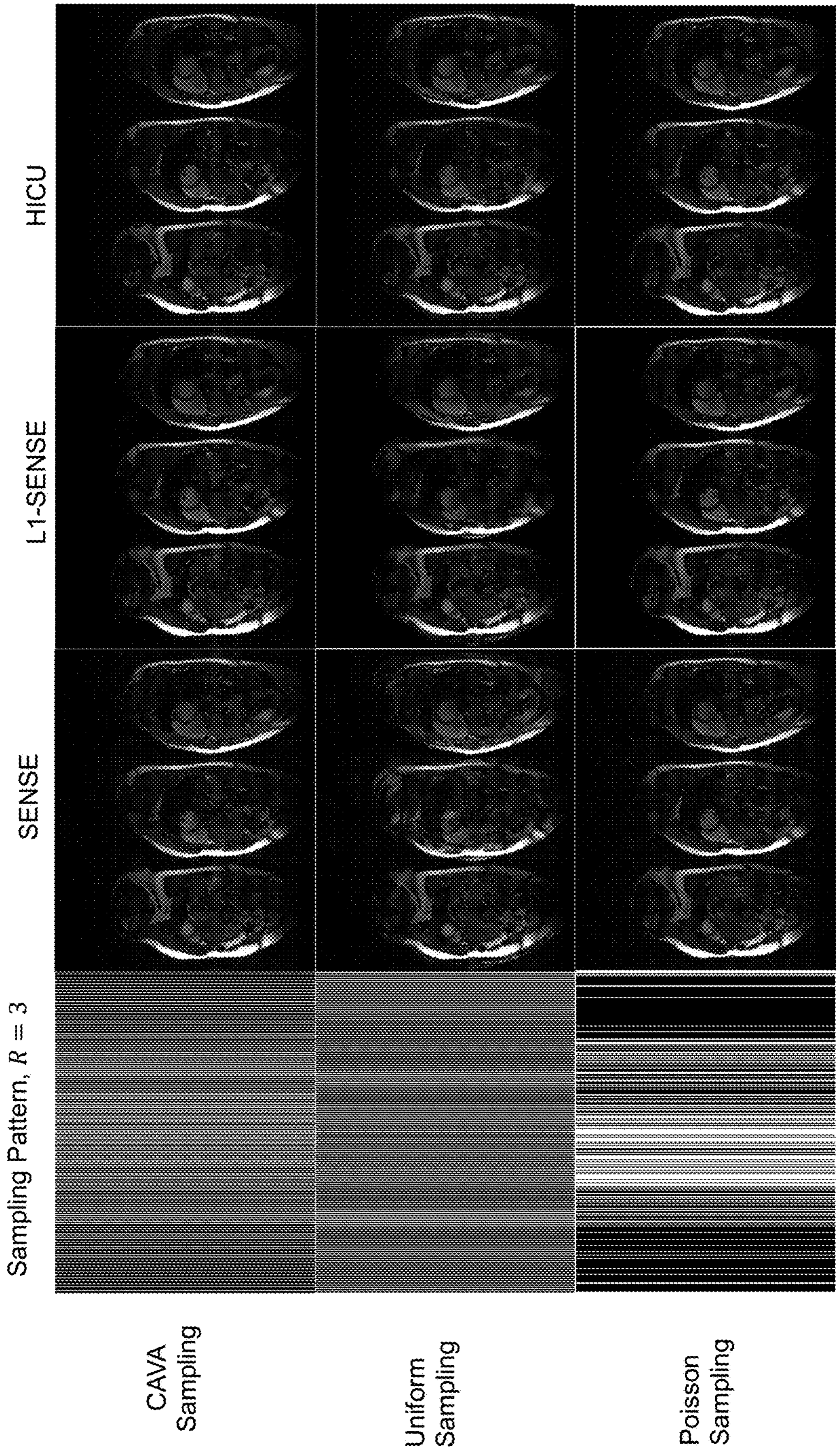

FIG. 14 is a set of images illustrating the capability of pairing SMILE with different sampling techniques (rows) and different image reconstruction techniques (columns).

Figure 15:
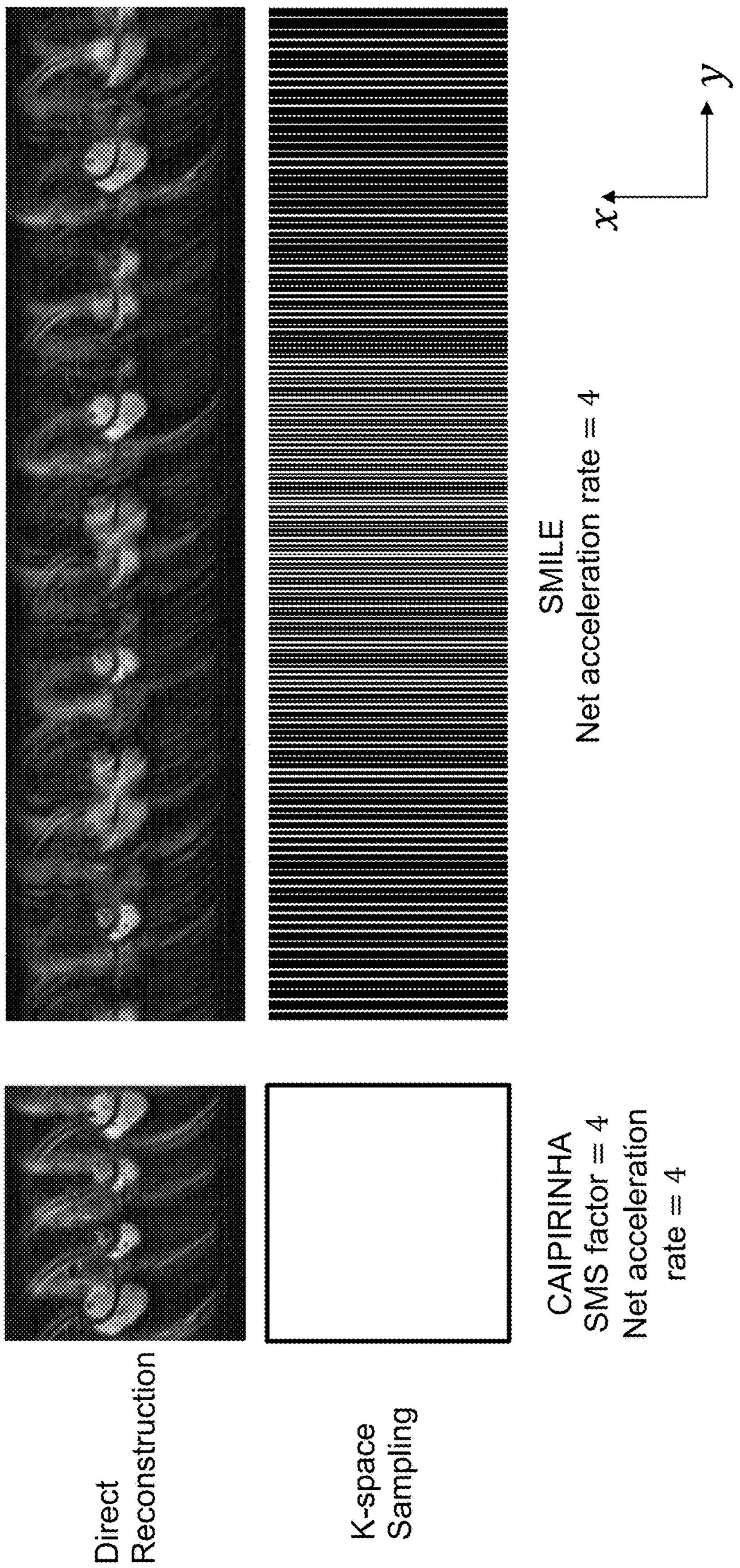

FIG. 15 shows images of CAIPIRINHA (left column) and SMILE acquisition (right column), where the two rows show direct reconstruction and k-space sampling.

Figure 16:
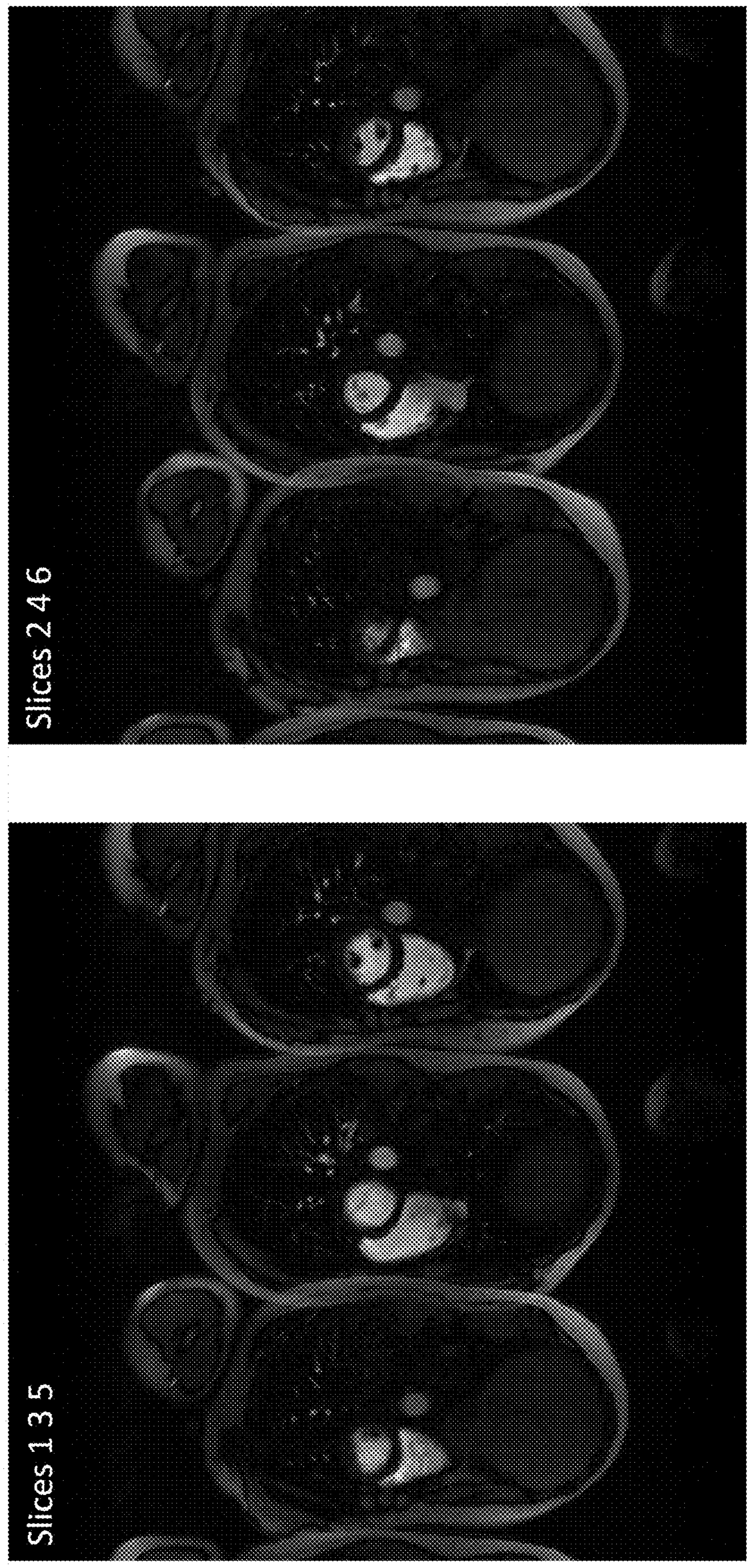

FIG. 16 are image slices showing the successful implementation of SMILE in 3-slices SMS prospective myocardial perfusion.

DETAILED DESCRIPTION OF THE INVENTION

Figure 1:
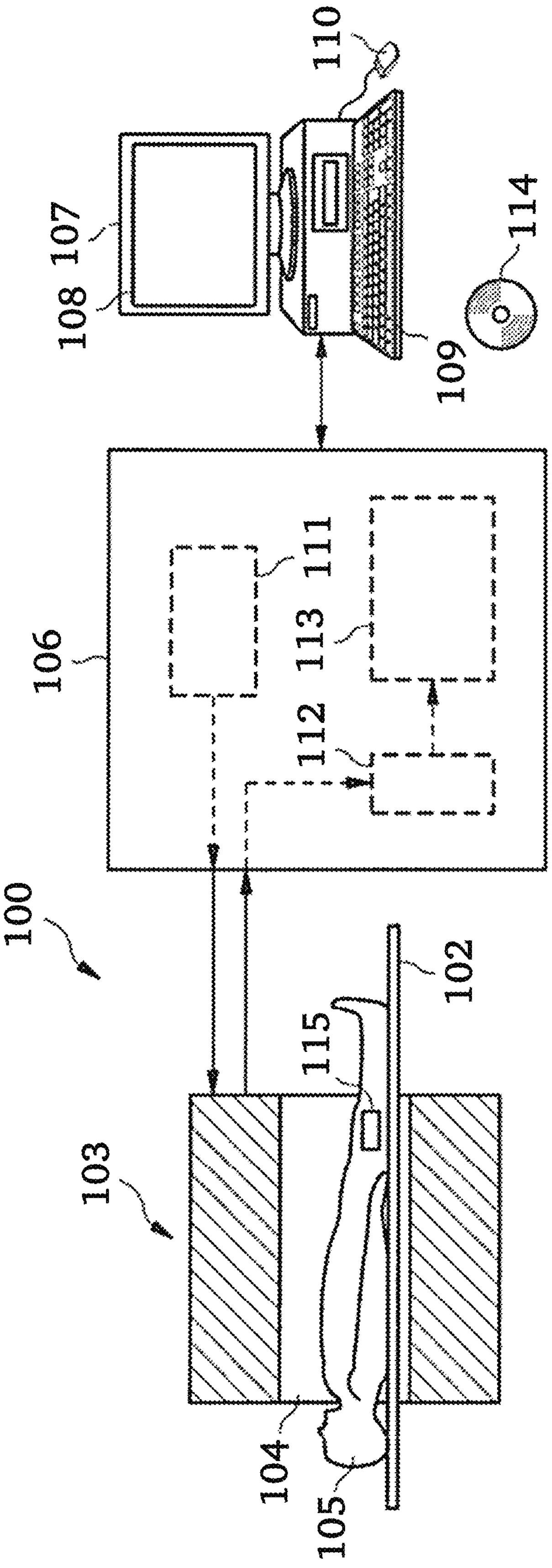
FIG. 1 is a schematic diagram illustrating an example magnetic resonance imaging (MRI) apparatus that may be used to acquire and process image data using embodiments of the present invention.

FIG. 1 is a view illustrating a structure of an example magnetic resonance imaging (MRI) apparatus 100 that may be used to acquire image data using embodiments of the present invention. Generally, the MRI apparatus 100 is a low-field or high-field system equipped with a high-end data processing unit (DPU) to enable the implementation of SMILE. The DPU may be comprised external GPU-equipped systems running, e.g., a Gadgetron framework, which was developed at the National Heart, Lung, and Blood Institute.

The MRI apparatus 100 includes a scanner 103 that generates magnetic fields used for the MR examination within a measurement space 104 having a patient table 102. In accordance with the present disclosure, the scanner 103 may include a wide bore 70 cm superconducting magnet having a field strength of approximately 0.35-7.0 Tesla (T).

A controller 106 includes an activation unit 111, a receiver device 112 and an evaluation module 113. During a SMILE measurement, MR data are recorded by the receiver device 112, such that MR data are acquired in, e.g., a set of multiple slices of region 115 that is located inside the body of a patient 105. The MRI apparatus 100 may include an 18-coil array (e.g., arranged as two 3×3 grids), support parallel imaging using SPIRiT, GRAPPA, SENSE, uniform, random or pseudo-random sampling patterns, compressed-sensing based reconstruction methods, and perform analog-to-digital conversion (ADC) at a gantry of the MRI apparatus 100.

An evaluation module 113 prepares the MR data such that they can be graphically presented on a monitor 108 of a computing device 107 and such that images can be displayed. In addition to the graphical presentation of the MR data. The computing device may include a keyboard 109 and a mouse 110. The computing device may include an Intel or a Ryzen central processing unit (CPU) or better, 64 GB of random access memory (RAM) or higher, Multi-GPU, GEFORCE RTX 4090 reconstruction hardware, support DiCOM 3.0, and support simultaneous scan and reconstruction.

Software for the controller 106 may be loaded into the controller 106 using the computing device 107. Such software may implement method(s) to process data acquired by the MRI apparatus 100, as described below. It is also possible for the computing device 107 to operate such software. Yet further, the software implementing the method(s) of the disclosure may be distributed on removable media 114 so that the software can be read from the removable media 114 by the computing device 107 and be copied either into the controller 106 or operated on the computing device 107 itself.

It should be understood that the various techniques described herein may be implemented in connection with hardware or software or, where appropriate, with a combination of both. Thus, the methods and apparatus of the presently disclosed subject matter, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computer, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs may implement or utilize the processes described in connection with the presently disclosed subject matter, e.g., through the use of an application programming interface (API), reusable controls, or the like. Such programs may be implemented in a high level procedural or object-oriented programming language to communicate with a computer system. However, the program(s) can be implemented in assembly or machine language, if desired. In any case, the language may be a compiled or interpreted language and it may be combined with hardware implementations.

Figure 2:
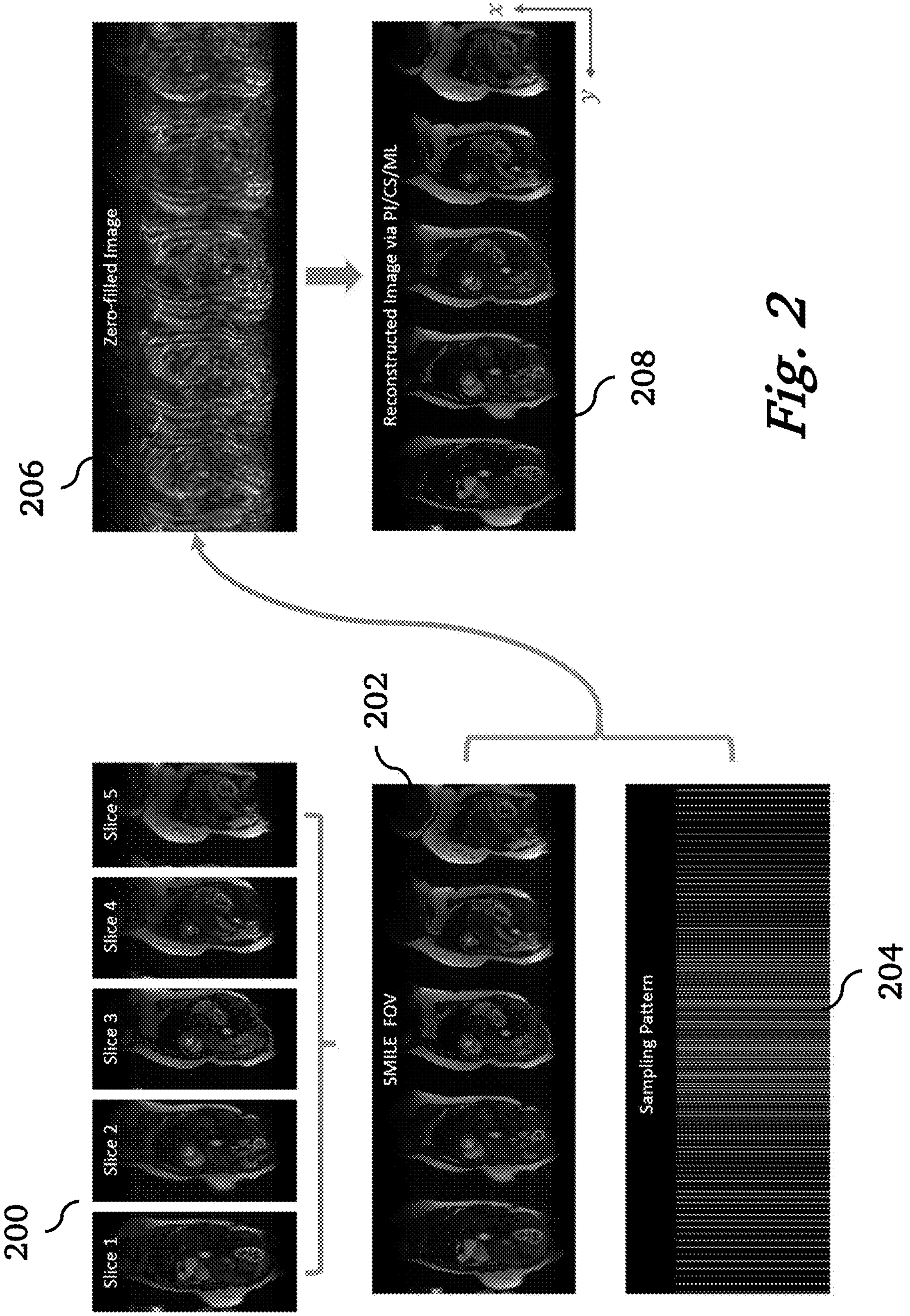
FIG. 2 is a processing pipeline illustrating the SMILE acquisition and reconstruction method according to embodiments of the present invention.

FIG. 2 illustrates the SMILE acquisition and reconstruction pipeline. Multiple image slices 200 are acquired and distributed within a SMILE extended field of view 202 (FOV) without overlapping of region of interest, which in this case is heart region. The distribution of slice images is achieved by applying linear phase modulation for the k-space phase encoding line of each image slice. Also shown is a sampling pattern 204 in the k-space. The direct inverse Fourier transform reconstruction of the zero-filled observed k-space data from the extended FOV 202 and sampling pattern 204 is shown in 206. The SMILE reconstruction from the zero-filled data 206 using either parallel imaging techniques or compressed sensing techniques or machine learning methods is shown in 208.

To appreciate the present invention, we systematically analyze current SMS acquisition and reconstruction methods from four closely related and essentially interconvertible perspectives. We show that most of the existing methods either impose substantial constraints on the sampling degree of freedom or inherit intrinsic limitations due to the viewpoint employed.

Upon reviewing the prevailing acquisition and reconstruction methods, we describe our concise and powerful accelerated SMS acquisition and reconstruction framework: Simultaneous Multislice Imaging via Linear phase modulated Extended field of view (SMILE). SMILE transforms the SMS problem into a 2D parallel imaging task, i.e., SMILE transforms the superimposed slice separation problem into a 2D de-aliasing problem, enables the direct implementation of parallel imaging reconstruction algorithms, and can theoretically get rid of significant "slice leakage" as long as the parallel imaging reconstruction is unbiased and well-conditioned. SMILE increases the PE undersampling degree of freedom by a factor of the number of slices, thereby benefiting the design of the sampling strategy. We also experimentally validate the slice-leakage-free and improved performance through retrospectively down-sampled T2 weighted brain, retrospectively downsampled cine, and prospectively undersampled in-vivo perfusion studies.

Regardless of the perspective employed in implementing SMS acquisition or reconstruction, the information in the 2D slice images is identical. Despite this theoretical equivalence, acquisition strategies and reconstruction performance differences may still arise. First, we will provide an overview of the four perspectives including the traditional perspective of the stack of 2D slice images. Then, we introduce SMILE, which can bypass the intrinsic limitations of existing methods. Subsequently, we will analyze SMILE alongside the current state-of-the-art acquisition and reconstruction techniques associated with each perspective.

Perspectives

Here we describe four perspectives: Stack of 2D, 3D, Extended 2D FOV in RO, and Extended 2D FOV in PE. After these four, we describe SMILE.

Stack of 2D Multi-coil 2D slice images are denoted as $$\mathbb{I}_s \in \mathbb{C}^{N_x \times N_y \times N_c},\ s \in \{1, \ldots, N_s\}, \tag{1}$$

where $N_x$, $N_y$ are the number of k-space points along the readout (RO) or phase encoding (PE) dimension. $N_c$ is number of coils, $N_s$ is number of slices.

3D 2D slice images $$\{I_s\}_{s=1}^{N_s}$$

can be stacked along the z dimension and viewed as a multi-coil 3D volume $\mathbb{I}_{3D}$:

$$\mathbb{I}_{3D} \in \mathbb{C}^{N_x \times N_y \times N_s \times N_c}. \tag{2}$$

This 3D perspective has been applied to understand and reconstruct Cartesian and non-Cartesian SMS.

Extended 2D FOV in RO $$\{I_s\}_{s=1}^{N_s}$$

can be concatenated along the RO dimension as $$\mathbb{I}_{2D,RO} \in \mathbb{C}^{N_xN_s \times N_y \times N_c}, \quad (3)$$

This perspective is utilized in work such as ROCK-SPIRiT. Through the property of the Fourier transform, the fully sampled SMS k-space (with a possible PE phase modulation like CAIPIRINHA) can construct a $1/N_s$ uniformly undersampled $N_s$×larger k-space.

Extended 2D FOV in PE $$\{\mathbb{I}_s\}_{s=1}^{N_s}$$

can be concatenated along the PE dimension as $$\mathbb{I}_{2D,PE} \in \mathbb{C}^{N_x \times N_yN_s \times N_c}, \quad (4)$$

This perspective was first employed in one of the earliest SMS techniques, POMP. Of note, POMP introduces phase modulation for each PE and foreshadows most SMS techniques. POMP predated the advent of parallel imaging by about a decade. Later, this perspective is also adopted in SENSE/GRAPPA to reconstruct superimposed slice images in the original FOV.

SMILE

Considering the limitation of extended 2D FOV in RO and 3D, which are analyzed later, we provide SMILE as a solution to circumvent these limitations. SMILE is built upon the extended 2D FOV in PE perspective. The SMILE acquisition encompasses three main steps:

- Adopting a sufficiently large FOV in the PE direction to encompass all slice images.
- Modulating the RF phase to shift the slice images, distributing them in the extended FOV.
- Exciting multiple slices simultaneously using a multiband RF pulse.

In this description, we adopt CAIPIRINHA phase modulation to uniformly distribute slices in the extended FOV, then the SMILE k-space can be written as $$\mathbb{K}(m\Delta k) = \sum_{s=1}^{N_s} \mathbb{K}_s(m\Delta k)e^{-j(m-1)(s-1)\frac{2\pi}{N_s}\Delta k}, \quad (5)$$

where $\mathbb{K}_s$ is $s^{th}$ slice's k-space for the extended FOV, m is the PE index, Δk is the PE gap. It is worth noting that the SMILE phase modulation does not necessarily need to be CAIPIRINHA; any RF modulation that shifts slice images without overlapping regions of interest (ROI) is acceptable.

Acquisition

Now we will analyze SMILE alongside the current state-of-the-art acquisition and reconstruction techniques associated with each of the perspectives described above.

Sampleable k-space and Sampling of Four Perspectives

For the extended 2D FOV in PE perspective, through RF phase modulation, the slices $$\{\mathbb{I}_s\}_{s=1}^{N_s}$$

are manipulated to distribute the image content in different parts of the extended 2D FOV in PE. The sampleable k-space is $$\sum_s \mathcal{P}_s \mathcal{F}_{xy} \mathcal{E} \mathbb{I}_s \in \mathbb{C}^{N_x \times N_yN_s \times N_c}, \quad (6)$$

where ε denotes extending FOV operator in PE dimension by $N_s$ times, $\mathcal{F}_{xy}$ denotes 2D Fourier transform along RO and PE, $\mathcal{P}_s$ denotes net phase modulation of the $s^{th}$ slice. Conceptually $\mathcal{P}_s$ can be arbitrary as long as there is no ROI overlap, and the POMP adopts CAIPIRINHA as $$\{\mathcal{P}_s\}_{s=1}^{N_s}.$$

For the other three perspectives, which are typically employed in conventional SMS techniques, the sampleable k-space shares the same general formulation.

$$\sum_s \mathcal{Q}_s \mathcal{F}_{xy} \mathbb{I}_s, \quad (7)$$

where $\mathcal{Q}_s$ is the net phase modulation for $s^{th}$ slice. Eq. (7) is usually a superimposed k-space of size $\mathbb{C}^{N_x \times N_y \times N_c}$ for common choices like identity $\mathcal{I}$, CAIPIRINHA. In this case, the cardinality of Eq. (6) is larger than Eq. (7) by a factor of $N_s$. Moreover, when $\mathcal{Q}_s=\mathcal{I}$, $$\{\mathcal{P}_s\}_{s=1}^{N_s}$$

is CAIPIRINHA, Eq. (7) is indeed a true subset of Eq. (6).

Figure 3:
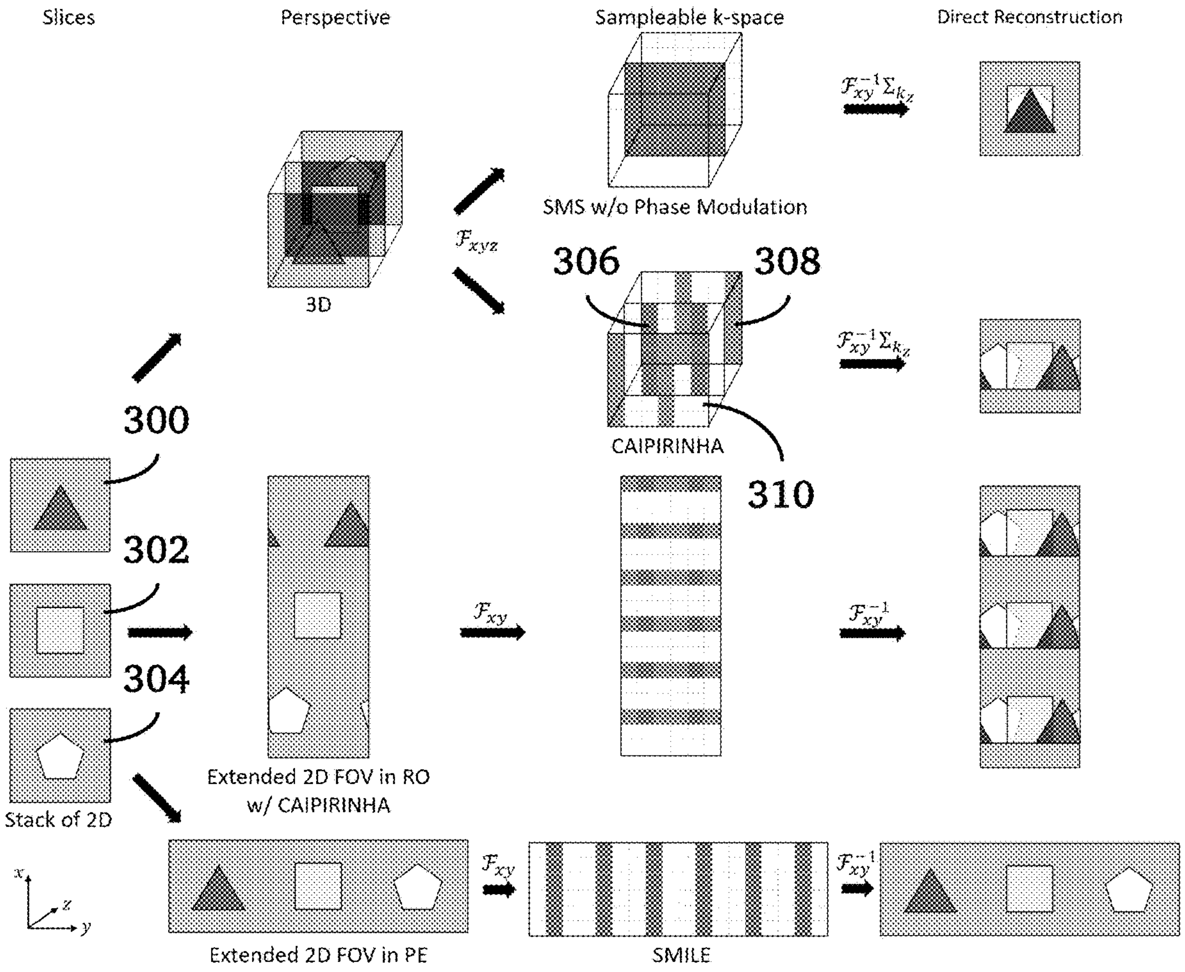
FIG. 3 is a schematic diagram showing different perspectives of SMS and their corresponding sampleable k-space and direction reconstruction results.

The close relationship between the four perspectives and their sampleable k-space points is illustrated in FIG. 3, which shows different perspectives of SMS and their corresponding sampleable k-space and direction reconstruction results. We use a triangle 300, a square 302, and a pentagon 304 to denote three different slice images. The sampleable k-space points are indicated as shaded blocks 306, 308. The empty k-space blocks 310 denote that they are not sampleable. The k-space points of the same shading are shared among different perspectives. For those of different shading, they are not. From the 3D perspective, we can see that CAIPIRINHA is equivalently capable of sampling a certain k-space with $k_z \neq 0$, benefiting the sampling conditioning compared to SMS without phase modulation $\mathcal{Q}_s=\mathcal{I}$. Although all 3D k-space points are achievable with full Fourier encoding for each PE, conventional SMS with CAIPIRINHA only samples a specific subset of 3D k-space points, which is compatible with reconstruction techniques like SG and SPSG. SMS without phase modulation or CAIPIRINHA in the extended 2D FOV in RO can only sample $1/N_s$, total k-space points. On the contrary, SMILE in the extended 2D FOV in PE perspective allows arbitrary sampling of PE and allows full sampling.

Other choices of $$\{Q_s\}_{s=1}^{N_s}$$

capable of full sampling include Hadamard, Fourier encoding, or any $$\{Q_s\}_{s=1}^{N_s}$$

that have multiple different phase combinations for each PE can make the linear sensing system Eq. (7) of $$\{I_s\}_{s=1}^{N_s}$$

full rank. For full Fourier encoding, although it theoretically enables sampling all points in the 3D k-space (as depicted in FIG. 3), it deviates from the commonly adopted CAIPIRINHA strategy and lacks compatibility with many SMS-specific techniques like SG and SPSG.

POMP as an instance of Eq. (6), was initially treated as non-acceleratable and was found to perform poorly with acceleration, i.e., sampling operator $\mathcal{D}$ applied to Eq. (6) is $\mathcal{I}$. Some studies revisited downsampling POMP but utilized uniform sampling due to steady-state limitations or to be compatible with online GRAPPA reconstruction. Recently a combination of bSSFP with extended 2D FOV in PE of two slices via restricted pseudo-random sampling was also developed. However, as we show later, certain uniform downsampling is potentially the worst sampling strategy for Eq. (6) at certain acceleration rates. In terms of reconstruction quality, uniform downsampling, combined with a lack of necessary modification of existing reconstruction methods, probably hindered prior investigators from developing this technique and achieving high-quality accelerated POMP reconstructions. Instead, the community has focused mainly on using CAIPIRINHA phase modulation over the original acquired FOV.

For Eq. (6), one interesting case is adopting net acceleration rate $R=kN_s$, $k\in\mathbb{Z}$, and a certain uniform sampling $\mathcal{D}$, the sampled k-space $$\mathcal{D}\sum_s \mathcal{P}_s\mathcal{F}_{xy}\mathcal{E}\mathbb{I}_s \subseteq DC\{\mathcal{F}_{xyz}\mathbb{I}_{3D}\}, \quad (8)$$

where DC{•} is taking the $k_z=0$ partition.

For Eq. (7), another interesting case is net $$R=N_s^2$$

(in-plane $R=N_s$) with a particular choice of uniform in-plane undersampling, there is no difference in measurements between $\mathcal{Q}_s=\mathcal{I}$ and CAIPIRINHA, where both samples only DC of k-space of $\mathbb{I}_{3D}$.

These two cases illustrate an important concept: Phase modulation and sampling pattern are both critical for good SMS reconstruction.

$$\{Q_s\}_{s=1}^{N_s}=CAIPIRINHA$$

in the original FOV Eq. (7) improves the sampling conditioning, but still has limitations of the corresponding sampleable k-space matrix. On the other hand, $\mathbb{I}_{2D}$. PE also utilizes phase modulation but enables full sampling as in POMP. Therefore, it is reasonable to conjecture that compatible sampling patterns for the $\mathbb{I}_{2D,\ PE}$ perspective should provide improved reconstruction, which is different from conventional understanding and is our motivation for SMILE.

Conventional SMS not only limits the PE undersampling degree of freedom, but also necessitates SENSE, SENSE/GRAPPA, SG, SPSG, ROCK-SPIRiT, and RO-SENSE-GRAPPA, with separate calibration data. Moreover, as shown later, this limitation of undersampling also likely results in certain linear prediction kernels being content-dependent, which especially impedes SMS applications with a large dynamic range of image content such as diffusion and cardiac perfusion imaging.

In addition to the primary steps outlined above, techniques like outer volume suppression can be included to reduce the size of the extended FOV. SMILE enables full sampling and supports arbitrary PE undersampling. Notably, SMILE can further enhance compressed sensing reconstruction by providing better incoherent sampling along additional dimensions compared to CAIPIRINHA acquisition. Moreover, SMILE does not necessarily need separate calibration data. Especially with additional dimensions such as the temporal dimension, reasonable linear prediction information like coil sensitivity map can be recovered from the temporal average. However, there is a lack of systematic studies exploring sampling and reconstruction in this perspective. This could be attributed to two main reasons:

Firstly, the uniform downsampling technique commonly favored for parallel imaging reconstruction, such as GRAPPA, may not be suitable, especially when the acceleration rate is an integer multiple of $N_s$. This could lead to sampling only the 3D k-space with $k_z=0$ in the 3D perspective, resulting in worsened sampling conditioning.

Secondly, the overrestricted GRAPPA kernel size used in the extended 2D FOV along the PE dimension might be a limiting factor. As we will elaborate later, increasing the kernel size by approximately a factor of $N_s$ along the PE dimension is necessary to achieve a reasonable reconstruction result.

Reconstruction

For convenience in analyzing different SMS reconstructions, we first define the general linear prediction assumption in many k-space reconstruction methods, and a theorem about the sufficient condition for the existence of an ideal linear prediction kernel/annihilating filter for the general discrete 3D k-space that is only dependent on the ideal finite impulse response (FIR) coil sensitivity map assumption.

Definition 1 (Linear Prediction) The k-space points can be approximately expressed as a linear combination of the appropriate choice of the neighboring k-space points, where the combination weight is shift invariant.

$$\rho[i] = \sum_{j \in \Omega} \omega[j]\rho[i-j] + \epsilon \forall\, i, \tag{9}$$

where ρ[i] is the k-space point to be linearly predicted; ω[j] is the combination weight; Ω is the set of indices of neighboring k-space points relative to the point of interest across involved dimensions such as $k_x$, $k_y$, z or $k_z$ and coil, determining the linear prediction kernel shape; ρ[i−j] is the neighboring k-space points; e is an approximation error.

The existence of linear prediction can be equivalently expressed as the existence of annihilating filters: the linear prediction kernel minus the corresponding extraction kernel constructs an annihilating filter, i.e., $$\sum_{j \in \Omega \cup \{0\}} \alpha[j]\rho[i-j] + \epsilon = 0 \,\forall\, i, \tag{10}$$

where $$\alpha[j] = \begin{cases} \omega[j], & j \neq 0 \\ -1, & j = 0 \end{cases}$$

Due to shift-invariance, the linear prediction or annihilation can be equivalently expressed as a valid convolution, denoted as *, with a kernel across the dimensions involved. Here, the valid convolution means that the convolution kernel does not slide beyond the boundaries.

Theorem 1 Suppose that the discrete k-space of the 3D coil sensitivity maps has the support of size $C_x\ k_x \times C_y\ k_y \times C_z\ k_x \times N_c$ coils centered at the origin. A sufficient condition for the existence of an annihilating filter only based on linearly independent coil sensitivity maps is that the kernel size indicated as $E_x\ k_x \times E_y\ k_y \times E_z\ k_z \times N_c$ coils satisfies $$E_x E_y E_z N_c > \prod_{i \in \{x,y,z\}} (C_i + E_i - 1). \tag{11}$$

Proof 1 Eq. (11) is to make the number of unknowns (number of elements within the kernel)>number of equations (the support size of the summation of convolution).

Here the linear independence of the coil sensitivity maps is defined as the linear independence of each vectorized coil sensitivity map. In practice, this can be achieved via coil compression. Moreover, we assume an ideal FIR model and the annihilating filter is also ideal, i.e., €=0 in Eq. (10).

Conventional SMS Reconstruction Besides SENSE, multiple SMS-specific reconstruction methods have been proposed. However, there has been some uncertainty regarding which acquisition and reconstruction methods are best suited for different imaging situations. By re-evaluating these methods from different perspectives, we can gain insight into their relative advantages and disadvantages.

SENSE/GRAPPA is the first GRAPPA-based algorithm capable of reconstructing accelerated SMS data, which adopts extended 2D FOV in PE perspective. It fills in missing k-space data using GRAPPA and partitions separate slices from the extended FOV.

SG and SPSG were initially proposed adopting a stack of 2D images perspective, but their assumed linear prediction can be equivalently described in 3D: the linear prediction of k-space for each slice from the superimposed k-space can be formulated as a shift-invariant linear prediction of unobserved 3D k-space from observed 3D k-space, as illustrated and explained in FIGS. 4A-4D. The SG/SPSG linear prediction kernel is equivalent to a 3D linear prediction kernel through the Fourier transformation.

Figures 4A, 4B, 4C, 4D:
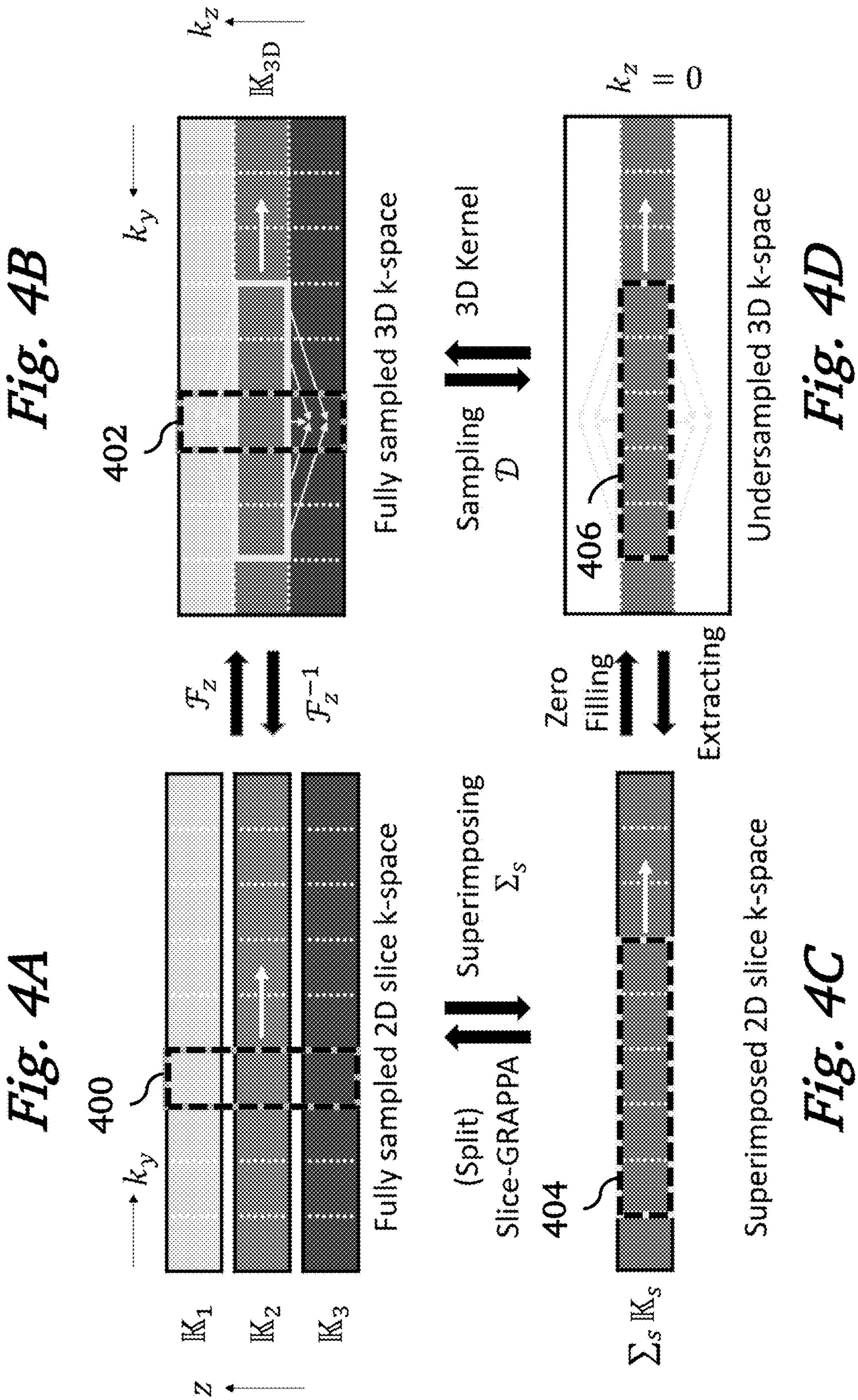
FIGS. 4A, 4B, 4C, 4D are schematic illustrations of the relationships between fully sampled 2D slice k-space (FIG. 4A), fully sampled 3D k-space (FIG. 4B), superimposed 2D slice k-space (FIG. 4C), and undersampled 3D k-space (FIG. 4D).

FIGS. 4A-4D show the relationship between (split) slice-GRAPPA and 3D linear prediction kernel. More specifically, these figures show the linear prediction of (split) slice-GRAPPA in two perspectives: a stack of 2D (FIGS. 4A, 4C) and 3D (FIGS. 4B, 4D). Without loss of generality, we adopt three slices and a (split) slice-GRAPPA kernel size of five along $k_y$ for illustration. The slice k-space shown is already with (optional) phase modulation before superimposition. We also hide the directions of $k_x$ and the coils for simplicity of illustration. The k-space points are represented as a square grid. The boxes 400 in FIG. 4A and the boxes 402 in FIG. 4B are associated with the Fourier transform along the z dimension. The horizontal white arrow denotes the sliding of the kernel position and the predicted k-space points. FIGS. 4A, 4B are associated with the 1D Fourier transform along the & direction. The superimposed slice k-space (FIG. 4C) can be treated as a $k_z$ direct current component of the 3D k-space (FIG. 4D). The rectangles 404, 406 in FIGS. 4C, 4D denotes the current kernel sliding position, and the rectangle 400 circumscribed k-space points in FIG. 4A denotes (split) slice-GRAPPA linear predicted k-space from FIG. 4C. The rectangle 402 circumscribed k-space points in FIG. 4B denotes 3D linear predicted k-space from FIG. 4D.

Given the kernel size, SG and SPSG assume $$SG: \sum_s \mathbb{K}_s * \mathbb{W}_{s,c} = K_{s,c} \tag{12}$$

$$SPSG: \begin{bmatrix} \mathbb{K}_1 \\ \vdots \\ \mathbb{K}_s \\ \vdots \\ \mathbb{K}_{N_s} \end{bmatrix} * \mathbb{W}_{s,c} = \begin{bmatrix} 0 \\ \vdots \\ K_{s,c} \\ \vdots \\ 0 \end{bmatrix} \tag{13}$$

where $\mathbb{K}_s = \mathcal{Q}_s \mathcal{F}_{xy} \mathbb{I}_s$; $K_{s,c}$ is $c^{th}$ coil k-space of $\mathbb{K}_s$; $\mathbb{W}_{s,c}$ is the SG or SPSG kernel. We can see that SPSG Eq. (13) is a sufficient but not necessary condition for SG Eq. (12). If we treat the stack of phase-modulated 2D slices as a 3D volume $\mathbb{K}_{3D}'$. It is worth noting that $\mathbb{K}_{3D}' \neq \mathcal{F}_{xyz} \mathbb{I}_{3D}$ in Eq. (2). Then both SG and SPSG try to use shift-invariant kernels to linearly predict the 3D k-space partition of $k_z \neq 0$ from the DC of $\mathbb{K}_{3D}'$, which is likely to be difficult under general conditions; a detailed analysis is given in the following section.

ROCK-SPIRiT treats the same measurement in the extended 2D FOV in RO and applies SPIRiT to fill in the missing k-space. Then each slice is partitioned from the extended FOV. The RO-SENSE-GRAPPA adopts the same RO-concatenation formulation.

SMILE Reconstruction In Eq. (6), suppose the continuous k-space of the linearly independent continuous 2D coil sensitivity maps has a support centered at the origin and of size $\leq C_x \Delta k_x\ k_x \times C_y \Delta k_y\ k_y \times N_c$ coils. Here, $\Delta k_x$, and $\Delta k_y$ represent the sampling spacing for the original FOV. Utilizing sampling and the properties of the Fourier transform, the discrete k-space of coil sensitivity maps in the extended FOV will have a support with a maximum size of $\leq C_x$ $k_x \times C_y N_s$ $k_y \times N_c$ coils, also centered at the origin. Leveraging Theorem 1, we can establish Corollary 1:

Corollary 1 For the extended 2D FOV in PE, an annihilating filter exists based solely on the linearly independent coil sensitivity maps if the kernel size is $E_x$ $k_x \times E_y$ $k_y \times N_c$ coils and satisfies $$E_x E_y N_c > (C_x + E_x - 1)(C_y N_s + E_y - 1). \tag{14}$$

If we relax $E_x, E_y \in \mathbb{R}$, by AM-GM inequality, we can obtain that when the smallest kernel size $E_x E_y N_c$ is achieved, $$\frac{C_x - 1}{E_x} = \frac{C_y N_s - 1}{E_y}. \tag{15}$$

Although the original problem is a constrained integer optimization, the above insight still holds asymptotically as $C_x$, $C_y \to \infty$.

In practice, the reasonable kernel size in k-space methods for extended 2D FOV in PE should roughly proportionally increase along the PE dimension by a factor of $N_s$. Take $N_s=5$ slices as an example. Suppose a single slice's smallest reasonable linear prediction kernel/annihilating filter size is 5 $k_x \times 5$ $k_y \times N_c$ coils based on the prior that coil sensitivity maps have limited k-space support. For five times larger FOV along the PE dimension, the corresponding smallest reasonable linear prediction kernel/annihilating filter size should roughly be 5 $k_x \times 25$ $k_y \times N_c$ coils, which is rather atypical for 2D parallel imaging. Using an insufficient kernel size may have also led to limitations in adopting this perspective previously. For SMILE coil sensitivity map extraction, our analysis implies that the calibration or autocalibration signal (ACS) region should also increase along the PE dimension to be large enough to capture the coil sensitivity maps. The increased kernel size should also be adopted for coil sensitivity map methods like ESPIRiT, and multiple sets of sensitivity maps might also be required when there is overlapping between different slices. Other priors, such as smooth-phase constraints, can also be incorporated into SMILE reconstruction if each slice image has a smooth phase and no abrupt phase change between slices.

SMILE allows the usage of any compatible 2D parallel imaging reconstruction methods and does not need SMS-specific reconstruction methods like SG and SPSG. The slice-leakage blocking aspect of the SPSG is transformed into a 2D de-aliasing problem and theoretically enables imaging free of slice leakage.

Bias and Content Dependence Analysis of Conventional SMS Reconstruction Due to the discontinuity of the 2D continuous coil sensitivity map and slice image content along the slice dimension, there is an intrinsic drawback in direct 3D reconstruction methods or their equivalent methods in this 3D perspective including SG and SPSG.

Let $\mathbb{S} \in \mathbb{C}^{N_x \times N_y \times N_s \times N_c}$ represent the discrete coil sensitivity map for a stack of linearly independent 2D slice coil sensitivity maps $\mathbb{S}_s \in \mathbb{C}^{N_x \times N_y \times 1 \times N_c}$ viewed in 3D perspective. We assume that supp($\mathcal{F}_{xy}$ $\mathbb{S}_s$), centered at the origin, is of size $C_x C_y N_c$. However, due to the discontinuity of S along the dimension z, $$|supp(\mathcal{F}_{xyz}\mathbb{S})| = C_x C_y N_s N_c. \tag{16}$$

Thus, $\mathcal{F}_{xyz}$ $\mathbb{S}$ is supported in whole $k_z$, which has multiple implications for the linear prediction kernel in 3D perspective.

Taking conventional SMS without in-plane acceleration as an example, SG and SPSG equivalently adopt a 3D annihilating filter$\in \mathbb{C}^{E_x \times E_y \times 1 \times N_c}$ plus one additional (possibly disconnected) point, where the former part corresponds to the convolution in the DC partition, the latter is the predicted point in another $k_z$ partition. Invoking Theorem 1, to enable the linear prediction, we need at least $$E_x E_y N_c > (C_x + E_x - 1)(C_y + E_y - 1)N_s. \tag{17}$$

Note that this is a lower bound to enable linear prediction when there is no additional point outside the $E_x$ $k_x \times E_y$ $k_y \times 1$ $k_z \times N_c$ coils cuboid support portion. With a further away disconnected point, it will be more difficult to guarantee the existence of the annihilating filter. For simplicity, we assume $C_x=C_y=C$. By the inequality of arithmetic and geometric means (AM-GM), the smallest kernel size is achieved when $E_x=E_y=E$ and $$E > \frac{C-1}{\sqrt{\frac{N_c}{N_s}} - 1}. \tag{18}$$

For example, when [C, $N_s$, $N_c$]=[20, 5, 16], Eq. (18) yields an output of E>24.08, which significantly surpasses the conventional experimental choice of kernel size for SPSG and SG. Conversely, in the case of single-slice parallel imaging, i.e., $N_s=1$, Eq. (18) produces E>6.33, which is in the same order of magnitude as the appropriate kernel size adopted in various 2D k-space reconstruction methods. Thus, it appears that the empirically chosen SPSG and SG kernel sizes might be insufficient to accurately capture the linear prediction based solely on the coil sensitivity map information.

However, larger SG and SPSG kernels likely preferentially capture linear prediction from image content, such as limited image support. Consequently, the SG and SPSG kernels often inevitably lead to bias or dependence on image content, resulting in increased slice leakage. Moreover, the assumption of slice leakage blocking in SPSG compared to SG might not always produce better results, a detailed analysis is given in the supporting information: Assumption Difference between SG and SPSG.

The analysis presented above can be readily extended to the direct 3D k-space reconstruction in 3D perspective: In contrast to real 3D volumetric MRI reconstruction, a larger 3D k-space kernel size becomes necessary. This increased kernel size may lead to the same bias and/or content dependence issues.

3D SENSE, employing a stack of 2D coil sensitivity maps, can remove bias and content dependence arising from the & dimension discontinuity. It effectively adopts the stack of 2D perspective. However, SENSE reconstruction without regularization typically underperforms k-space methods in terms of signal-to-noise ratio (SNR), particularly for highly ill-conditioned SMS tasks at high acceleration rates.

Bias and Content Dependence Analysis of SMILE Reconstruction K-space linear predictability for parallel imaging comes mainly from two sources: coil sensitivity map smoothness and limited image support.

Although there is no theoretical guarantee that specific linear prediction kernels in methods like GRAPPA only depend on the coil sensitivity maps, especially when the image has limited support, previous studies, and practical GRAPPA implementation experimentally validate its robust performance and approximate content-independent kernel across many imaging scenarios. Further analysis and an example is provided in the supporting information: Kernel Dependence of Image Content. This means that the chosen kernel size $E_x$ $k_y \times E_y$ $k_y \times N_c$ coils is probably sufficient to leverage coil smoothness prior and insufficient to capture the limited image support prior. If all slice images have this property, then we could find a content-independent kernel for the extended 2D FOV in PE as well under appropriate conditions.

On the one hand, let $C_x=C_y=C>>1$ for simplicity. Invoking Theorem 1, the smallest kernel for each slice to capture coil smoothness asymptotically satisfies $$\begin{cases} E_x^2 N_c > (C+E_x)^2 \\ E_y = E_x \end{cases}. \tag{19}$$

Invoking Corollary 1, the smallest kernel size for SMILE to capture coil smoothness asymptotically satisfies $$\begin{cases} E_x^2 N_c > (C+E_x)^2 \\ E_y = E_x N_s \end{cases}. \tag{20}$$

This expansion increases the kernel size in Eq. (19) by a factor of $N_s$ along PE.

On the other hand, linear prediction kernels to capture the limited image support for each slice within the original FOV also need to expand by a factor of $N_s$ along PE in the extended FOV, as per the properties of the Fourier transform of zero padding.

Hence, if the smallest linear prediction kernel for each slice within the original FOV is content-independent, then the smallest linear prediction kernel for the SMILE extended FOV—featuring narrow gaps or even partial overlaps between slice images—will also probably remain content-independent. Consequently, achieving content independence through adequate SMILE acquisition is relatively easy. The SMILE SENSE reconstruction by nature can avoid bias and content dependence.

Slice Leakage Analysis The notion of slice leakage or "slice blocking" has not been applied to conventional accelerated parallel imaging. Instead, it is a concept that arises from the implementation of SG or SPSG methods due to their susceptibility to bias and kernel content influences. Notably, analogous to parallel imaging, slice leakage or blockage does not factor into the SMILE technique. Consequently, analytical tools for leakage assessment, such as the linear system leakage approach (LSLA), are unsuitable for evaluating SMILE.

Within the scope of SMILE, so long as the reconstruction kernel is of adequate size, the resulting reconstruction is expected to be unbiased, with noise perturbations serving as the sole influencing factor. In scenarios where reconstructions face challenges at higher R values, residual aliasing can be quantified using metrics like mean squared error.

g-Factor Analysis The g-factor measures the exacerbation of ill-conditioning during image reconstruction, coupled with the impact of reduced signal averaging (represented by $\sqrt{R}$). However, the preconditioning for calculating the g-factor assumes that the reconstruction is an unbiased yet noisy version of the unaccelerated image. Consequently, bias in many conventional SMS reconstructions hinders the suitability of the g-factor for analysis.

In contrast, unbiased SMILE reconstruction allows for g-factor analysis of different SMILE sampling patterns. Although the optimal sampling pattern for SMILE has not been fully analyzed, we can avoid certain worst-case scenarios like uniform sampling with acceleration rate $R=kN_s$. We illustrate this using SENSE reconstruction and pseudo multiple replica method with 50 Monte Carlo simulation trials to calculate the g-factor. We use CAVA variable density sampling (not optimized for SMILE) and uniform sampling as illustration patterns with B1 dataset (MB=6) used in the later retrospective T2 weighted brain study. The g-factor is shown in FIG. 5.

Figure 5:
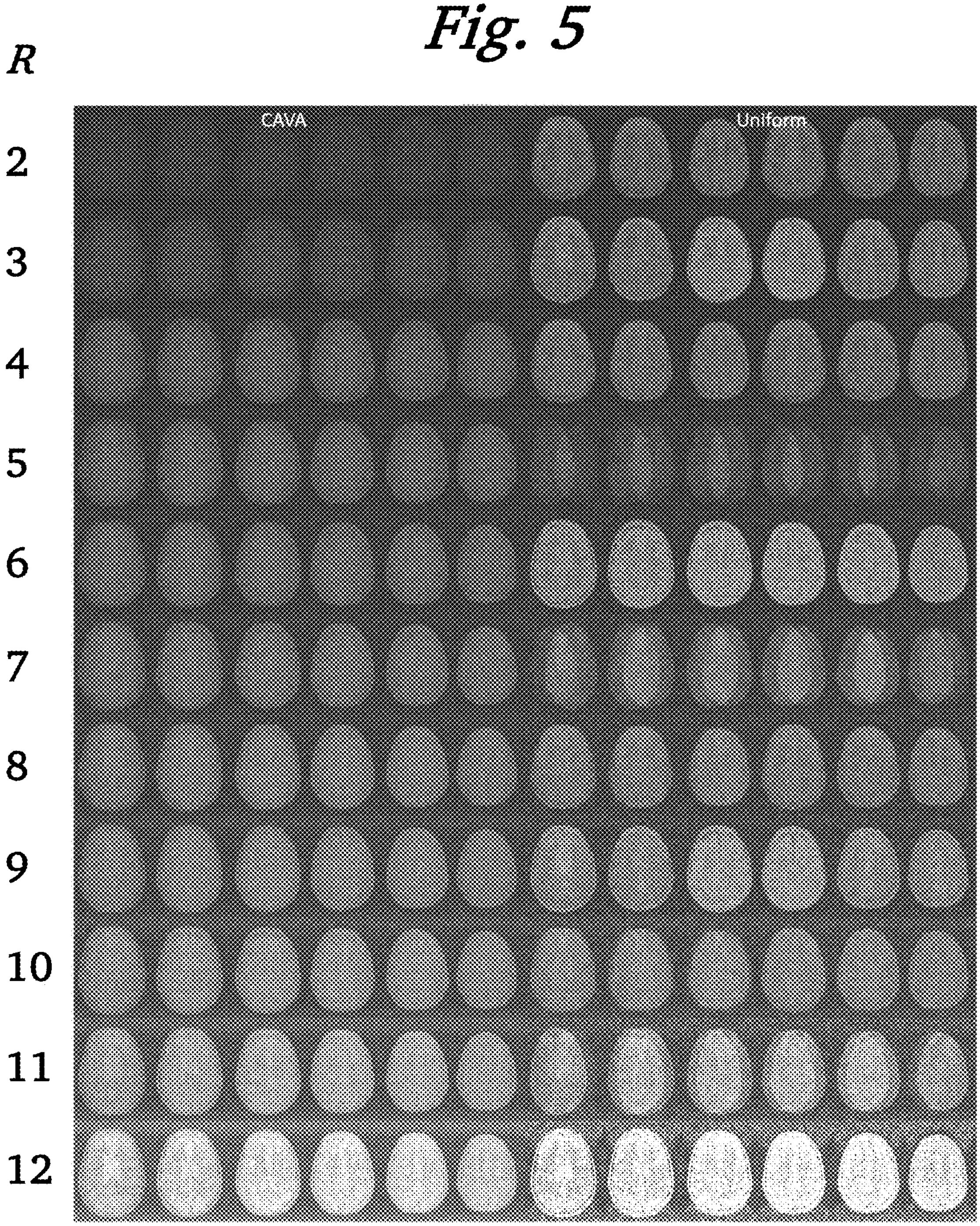
FIG. 5 is a set of images illustrating the g-factor using CAVA variable density sampling (left six columns) and uniform sampling with SENSE reconstruction (right six columns) for different acceleration rates R (shown in the eleven rows).

FIG. 5 is a set of images illustrating the g-factor for retrospective T2 brain study for dataset B1 using CAVA variable density sampling and uniform sampling with SENSE reconstruction. The g-factor is calculated using a pseudo multiple replica method with Monte Carlo simulation trials equal to 50 and windowed to [0, 25]. The illustration crops off the empty background region illustrated in FIG. 6 to save space. The rows correspond to different acceleration rates R. For R=2~12, the average g factor of the brain region for CAVA is 2.08, 2.73, 3.89, 4.26, 4.83, 5.55, 6.50, 7.31, 8.69, 11.19, 16.59, for uniform sampling are 4.40, 6.02, 4.88, 3.34, 8.20, 5.58, 6.49, 8.59, 8.04, 11.18, 22.21.

As expected, a stark contrast emerges when R=6, 12: variable density sampling significantly outperforms uniform sampling. Interestingly, the average g-factors for uniform sampling exhibit a nonmonotonic pattern as the acceleration rate R increases. They increase consistently with CAVA and display a more diffused pattern across all slices. In contrast, uniform sampling shows pronounced structural aliasing but lower g-factors, particularly at R=5 and 7, which are the closest co-prime values to 6. This implies no direct overlap of aliasing between slices. This explanation, based on the coprime relationship between MB and R, also clarifies why R=2, 3 performs notably worse.

Methods

Retrospective Downsampled T2 Weighted Brain Study We applied modulation and downsampling to twenty T2-weighted multislice brain fastMRI data sets (B1 to B20) using CAIPIRINHA and SMILE with MB=6. The datasets were compressed into 12 coils, and we extracted the center six slices. In some cases, interleaving was not feasible due to an insufficient number of slices; therefore, we chose to use center slices to maintain consistency across all datasets.

For all acquisitions, net R=6, except for separate calibration data. CAIPIRINHA employed full in-plane sampling, thus no further reconstruction was necessary after slice separation. SMILE adopted CAVA sampling pattern shown in FIG. 6. 31 center PE for each slice was treated as separate calibration data for CAIPIRINHA, which was equivalently transformed into SMILE calibration data with 31×6=186 PE line.

The acquisition and reconstruction combinations were: CAIPI+{SENSE, SPSG, SG, ROCK-SPIRiT, HICU 2D}, SMILE+{SENSE, SPIRiT, HICU 2D}. Although HICU is a general calibrationless method, for a fair comparison, we adapted HICU to utilize the calibration data. In the case of CAIPI+HICU 2D, we implemented the extended 2D FOV in RO perspective. The reconstruction quality of HICU 2D should be very similar to PRUNO and AC-LORAKS when adopting the same kernel size and rank value. We used 2D Walsh with a block size of 3 x×3 y×12 coils to extract coil sensitivity maps.

All reconstruction parameters were fine-tuned based on a separate dataset to minimize mean squared error. The optimal kernel sizes were as follows:

$$SG\text{: } 11\ kx \times 11\ k_y \times 12 \text{ coils,}$$

$$SPSG\text{: } 15\ kx \times 15\ k_y \times 12 \text{ coils,}$$

$$\text{ROCK-SPIRiT: } 31\ k_x \times 5\ k_y \times 12 \text{ coils,}$$

$$\text{SPIRiT: } 5\ k_x \times 31\ k_y \times 12 \text{ coils,}$$

$$HICU\ 2D\text{: } 5\ k_x \times 30\ k_y \times 12 \text{ coils.}$$

Signal-to-error ratio (SER) and structural similarity index (SSIM) were used as quality metrics. The SER is defined as $$\frac{\|\mathbb{K}\|_F}{\|\hat{\mathbb{K}} - \mathbb{K}\|_F}, \tag{21}$$

where $\mathbb{K}$, $\hat{\mathbb{K}}$ represents the fully sampled k-space data and the reconstructed k-space, $\|\bullet\|_F$ denotes the Frobenius norm. Statistical analysis of SER and SSIM was conducted across the different techniques using a two-way repeated measures MANOVA.

Retrospective Downsampled Cine Study We applied modulation and downsampling to eight 3 T/1.5 T multislice OCMR CINE datasets (3 T: D1, D2; 1.5 T: D3~D8) using CAIPIRINHA and SMILE with MB=5. Datasets were compressed to 16 coils, with five slices selected to intersect the heart, interleaved by one slice. Physical implementation can be facilitated by decreasing the flip angle and adopting GC-LOLA.

For all acquisitions, net R=5, except for separate calibration data. CAIPIRINHA employed full in-plane sampling, SMILE adopted CAVA, as shown in FIG. 6. The figure shows using B1 and D1 frame 1 to illustrate the acquisition difference between CAIPIRINHA (left image in each row) and SMILE (right image in each row). Net acceleration rates are the same for CAIPIRINHA and SMILE. There is no in-plane downsampling for CAIPIRINHA, while SMILE adopts the CAVA sampling pattern. CAIPIRINHA shifts and overlaps the slice images, while SMILE, through variable density sampling, aliases the slice images in the extended FOV. Direct Recon and K-space Sampling are shown in subsequent rows for Brain (top two rows) and Cine (bottom two rows).

Per-frame and spatial-temporal joint reconstructions were performed. Apart from the eight acquisition+spatial reconstruction combinations applied in the brain study, three acquisition+spatial-temporal reconstruction combinations were incorporated: CAIPI+SENSE+stationary wavelet transform (SWT) regularization, SMILE+{SENSE+SWT, spatial-temporal HICU (HICU)}

We included 32 PE for each slice as separate calibration data for CAIPIRINHA. We transformed these into equivalent 32×5=160 PE as separate calibration data for SMILE+{SPIRiT, HICU 2D}. Using the greater degree of sampling freedom while preserving the total number of PE lines, we merged the 160 lines into the acquisition for all other SMILE+reconstructions. We used the fully sampled time average to extract the coil sensitivity map for SMILE+SENSE+(SWT). HICU is calibrationless. The coil sensitivity extraction method was 2D Walsh with block size 3 x×3 y×16 coils.

All reconstruction parameters were fine-tuned based on a separate dataset to minimize mean squared error. The optimal kernel sizes were:

$$SG\text{: } 9\ kx \times 9\ k_y \times 16 \text{ coils,}$$

$$SPSG\text{: } 11\ kx \times 11\ k_y \times 16 \text{ coils,}$$

$$\text{ROCK-SPIRiT: } 45\ k_x \times 9\ k_y \times 16 \text{ coils,}$$

$$\text{SPIRiT, } HICU\ 2D\text{: } 9\ k_x \times 45\ k_y \times 16 \text{ coils,}$$

$$HICU\ 2D\text{: } 9\ k_x \times 45\ k_y \times 5\ t \times 16 \text{ coils.}$$

SER and SSIM were analyzed between techniques using a two-way repeated measures MANOVA for the six 1.5 T datasets.

Prospective Undersampled Perfusion Study Resting SMILE perfusion imaging was performed on three patients who underwent clinically ordered CMR studies under an IRB-approved protocol. Imaging was performed with breath-holding during intravenous injection of 0.075 mmol/kg Gadovist at 3 cc/second over 60 heartbeats in a 3 T scanner (Siemens MAGNETOM Skyra). A saturation recovery gradient echo SMILE pulse sequence with R=8, MB=3, CAVA sampling pattern, resolution 1.5×1.5 mm, 2 or 3 saturation blocks were used to achieve 6 or 9 short axis slices covering the ventricle.

The data was first compressed to 16 coils. The reconstruction method was HICU with kernel size 9 $k_x$×27 $k_y$×10 t×16 coils, rank 800. Temporal sliding Gaussian extrapolated k-space was adopted as initialization. Plug-in SWT denoiser with $3\times10^{-3}$ as Lagrangian multiplier was also paired with HICU.

Results

FIGS. 7A-7F show radar charts of the reconstruction quality in terms of SER and SSIM for retrospectively downsampled brain and cine studies for datasets B1 to B20 and D1 to D8 from different acquisition+reconstruction combinations. For the cine study, we show the 2D reconstruction and 2D+t reconstruction separately.

FIGS. 8A-8D show the mean SER and SSIM of shared reconstruction combinations for retrospective brain and cine studies for datasets B1 to B20 and D1 to D8 across two acquisitions for two retrospectively downsampled studies, where we treat ROCK-SPIRiT as a variant of SPIRiT. For both studies, the repeated measures two-way MANOVA show acquisition, methods, and their intersection all show statistically significant differences ($p<0.001$). SER values in MANOVA are not in dB units. For both studies, regardless of acquisition or metrics, SENSE<SPIRiT<HICU 2D (<HICU). SMILE outperforms CAIPIRINHA in all reconstruction methods except for the slightly lower SSIM value of SENSE in the cine study.

FIG. 9 shows the representative reconstruction results for the brain study. SENSE has larger but less structured error. The k-space methods for both brain and cine studies show less error than the SENSE, but many of them show slice leakage or structured error. The error of SPSG is larger than that of SG but less structured. HICU 2D slightly outperforms SPIRiT. The figure shows representative T2 weighted brain reconstruction comparison for B8. Net acceleration rate R=6 with additional 31-line calibration data for each slice for CAIPIRINHA or equivalent 186-line calibration data for SMILE. CAIPIRINHA has no in-plane acceleration. SMILE adopts the CAVA sampling pattern. We also include a 4.1× absolute error map, windowed to 50% of the maximum error value.

FIG. 10 shows a representative reconstructed frames of the cine study. We can observe slice leakage for CAIPIRINHA, especially in the second and third slices. The bright spot close to the myocardium in SG, SPSG, and ROCK-SPIRiT in the second slice is caused by a bright lung vessel from the first slice. The bright spot is not observed in SENSE (+SWT). SMILE has no visual slice leakage, but nonstructural residual error or blur. The figure shows one representative frame of the cine reconstruction comparison for D1. Net acceleration rate R=5 with an additional 32-line calibration of each slice for CAIPIRINHA or equivalent 160-line calibration for SMILE+SPIRiT and SMILE+HICU 2D. CAIPIRINHA has no in-plane acceleration. SMILE adopts the CAVA sampling pattern. For SMILE+SENSE (+SWT) and SMILE+HICU, we merge the additional calibration PE into the sampling pattern and do not require separate calibration data. We also include a 4.3× absolute error map windowed to 50% of the maximum error value.

FIG. 11 shows a representative frame of the prospectively undersampled SMILE perfusion study. The image exhibits no visual slice leakage at net R>MB. The figure shows one representative frame of one prospectively undersampled MB=3, R=8 patient perfusion SMILE+HICU+paired SWT denoiser reconstruction results. The sampling pattern is CAVA. Three saturation blocks to achieve nine slices of coverage. Three slice groups 1 4 7, 2 5 8, 3 6 9. Slice images are reorganized to be concatenated from 1 to 9. The image is windowed to 60% of the maximum voxel intensity.

Discussion

MB and in-plane acceleration factor into net R in conventional SMS, but are combined into a single in-plane acceleration rate in SMILE. Consequently, when targeting the same net R, SMILE has no time penalty. This is because SMILE samples the same number of PE lines as conventional SMS but with added flexibility to choose R independent of MB.

There are some variations in performance among conventional SMS techniques, with ROCK-SPIRiT surpassing SG and SPSG. One reason is that ROCK-SPIRiT's extended 2D FOV in RO perspective reduces bias in the kernel training than the 3D perspective intrinsically adopted in SG and SPSG. Another reason is that SPIRiT outperforms GRAPPA in exploiting the linear prediction of all neighboring k-space points. However, the remaining presence of bright-spot "slice leakage" in cine study in ROCK-SPIRiT is likely due to the content dependency of the trained SPIRiT kernel. SENSE, as discussed above, has a smaller SER but avoids this issue.

The lower SSIM in SMILE SENSE compared to CAIPIRINHA SENSE in cine study is likely because SSIM is sensitive to residual aliasing. CAVA does not sample DC for all frames, potentially increasing residual aliasing in 2D SMILE SENSE, leading to reduced SSIM.

As previously analyzed and confirmed through brain and cine studies, unbiased and content-independent SMILE reconstruction can avoid "slice leakage". Furthermore, the greater flexibility in the SMILE PE undersampling helps significantly improve performance compared to conventional SMS reconstruction, particularly when additional dimensions are considered. For example, in the cine study, SWT can benefit SMILE+SENSE more than CAIPI+SENSE in SER (p=0.003), attributed to SMILE's ability to accommodate arbitrary PE sampling, enhancing incoherent k-space sampling, and widening the performance gap.

Furthermore, our investigation of optimal kernel sizes for CAIPI+ROCK-SPIRiT, SMILE+{SPIRiT, HICU 2D, HICU} affirms our prior analysis regarding the influence of extended FOV on the k-space reconstruction kernel size: k-space linear prediction kernel size should expand in PE proportionally with the number of slices $N_s$, which is a counter-conventional practice.

The versatility of the SMILE strategy extends beyond its immediate context, making it compatible with applications such as Blipped-CAIPIRINHA and beyond RF-excitation modulation. With the SMILE approach, more optimized sampling and phase modulation strategies are likely to emerge, expanding its potential for various MRI applications.

FIG. 14 illustrates the capability of pairing SMILE with arbitrary sampling and any suitable image reconstruction techniques with examples using Cartesian variable density and adjustable temporal resolution (CAVA) sampling, uniform sampling, and variable density Poisson disk sampling with three reconstruction methods: a nonregularized parallel imaging reconstruction method (SENSE), a compressed sensing based method (L1-SENSE), and high-dimensional fast convolutional framework (HICU). Additional suitable reconstruction methods also include machine-learning-based reconstruction. The figure demonstrates that SMILE can be paired with arbitrary sampling patterns (CAVA, uniform and Poisson sampling) and reconstruction methods (SENSE, compressed sensing based L1-SENSE, and HICU). The images shown are with net acceleration rate R=3. The shared separate autocalibration region is used for coil sensitivity map extraction for SENSE, L1-SENSE and null space extraction for HICU.

FIG. 15 shows images of CAIPIRINHA and SMILE acquisition, illustrating the differences between undersampled SMILE and CAIPIRINHA acquisition, where SMILE aliased slice images, CAIPIRINHA overlaps the shifted slice images.

FIG. 16 shows the successful implementation of SMILE in 3-slices SMS prospective myocardial perfusion, adopting CAVA variable density sampling and HICU reconstruction. The figure shows prospectively undersampled patient perfusion SMILE acquisition+CAVA variable density sampling+HICU reconstruction results. Acceleration rate R=8.2 saturation blocks to achieve 6 slices of coverage.

Assumption Difference between SG and SPSG The Venn diagram for $N_s$=3 slices in FIGS. 12A-12B shows the different assumptions of Slice-GRAPPA (SG) and Split Slice-GRAPPA (SPSG) illustrated using three slices, where $\mathbb{K}_s*(\sim)$ denotes the convolution operator at a given kernel size, and $\mathcal{N}$ (•) denotes the null space of the linear operator.

From the reconstruction side, we have proven that SG linear prediction kernels are equivalent to 3D linear prediction kernels. Compared to SG, SPSG has the additional assumption that the linear prediction kernel for a certain slice will annihilate the other slice's k-space. However, there is no guarantee that this assumption will always hold. In FIGS. 12A-12B, take $\mathbb{W}_{2,c}$ as an example. The cyan region for SPSG might be empty. From ideal null space analysis, when the cyan region is nonempty, i.e., $\mathcal{N}(\mathbb{K}_1*(\bullet))\cap\mathcal{N}(\mathbb{K}_3*(\bullet))\cap\mathcal{N}(\mathbb{K}_2*(\bullet))^c\neq\emptyset$, SPSG could provide an improved reconstruction of the second slice. When the cyan region is empty, i.e., $\mathcal{N}(\mathbb{K}_1*(\bullet))\cap\mathcal{N}(\mathbb{K}_3*(\bullet))\cap\mathcal{N}(\mathbb{K}_2*(\bullet))^c=\emptyset$, SPSG could harm the reconstruction of the second slice.

Kernel Dependence of Image Content Suppose that the discrete proton density image $I\in\mathbb{R}^{N_x\times N_y}$, discrete FIR coil sensitivity map $\mathbb{S}\in\mathbb{C}^{N_x\times N_y\times N_c}$, with each coil's sensitivity map $S_c$, then the coil image is $\mathbb{I}=I\circ\mathbb{S}$, where $\circ$ denotes Hadamard multiplication. $\forall a_c\in\mathbb{C}^{E\times E}$ s.t. $(\mathcal{F}_{xy}I)*a_c=0$, $c\in\{1, \ldots, N_c\}$, let $\mathbb{A}\in\mathbb{C}^{E\times E\times N_c}$ be the stack of $$\{a_c\}_{i=1}^{N_c}$$

Along the coil dimension, then $$(\mathcal{F}_{xy}\mathbb{I})*\mathbb{A}=\sum_{c}^{N_c}(\mathcal{F}_{xy}S_c)*(\mathcal{F}_{xy}I)*a_c=0, \tag{22}$$

which means the $\mathbb{A}$ is an annihilating filter for $\mathbb{I}$. On the other hand, $\forall\mathbb{B}\in\mathbb{C}^{E\times E\times N_c}$ s.t. $(\mathcal{F}_{xy}\mathbb{S})*\mathbb{B}=0$, $$(\mathcal{F}_{xy}\mathbb{I})*\mathbb{B}=(\mathcal{F}_{xy}I)*(\mathcal{F}_{xy}\mathbb{S})*\mathbb{B}=0 \tag{23}$$

Eq. (22) and Eq. (23) implies that there is no assurance that the annihilating filter/linear prediction kernel in the k-space remains entirely unaffected by the image content. It is possible $\exists E$, s.t. $\mathcal{N}((\mathcal{F}_{xy}I)*(\bullet))\neq\emptyset$; i.e., $\exists$ content-dependent annihilating filter.

This concept is visually depicted in FIG. 13, where we simulate a Shepp-Logan phantom as a proton density image $I\in\mathbb{R}^{100\times 100}$ with limited image support, and randomly generated FIR coil sensitivity maps $\mathbb{S}$ with k-space support 8 $k_x\times 8$ $k_y\times 5$ coils. For different kernel sizes E, we calculate the singular value decomposition of the convolution operation from image content $SVD((\mathcal{F}_{xy}I)*(\bullet))$ and coil sensitivity map $SVD((\mathcal{F}_{xy}\mathbb{S})*(\bullet))$.

The result shows that $N((\mathcal{F}_{xy}I)*(\bullet)\neq\emptyset$ for $E\geq 4$, $\mathcal{N}((\mathcal{F}_{xy}\mathbb{S})*(\bullet)\neq\emptyset$ for $E\geq 6$. It means that the annihilating filters with $E\in\{4, 5\}$ are based solely on the image content rather than the coil sensitivity map. Given this example, it becomes evident that any assurance of the linear prediction kernels'/annihilating filters' sole dependence on the coil sensitivity map, devoid of any influence from the image content, is not guaranteed.

FIG. 13A shows Simulated Shepp-Logan phantom and five randomly generated coil sensitivity maps with k-space support 8 $k_x\times 8$ $k_y$. FIG. 13B shows singular values for convolutional operation from the image content only $SVD((\mathcal{F}_{xy}I)*(\bullet))$ and from the coil sensitivity map only $SVD((\mathcal{F}_{xy}\mathbb{S})*(\bullet))$ for different kernel size E.

CONCLUSIONS

We have analyzed the limitations of conventional SMS techniques and described SMILE as a general accelerated SMS framework with broad applicability in MRI. SMILE offers greater PE undersampling flexibility, unbiased and content-independent kernel training, and the ability to eliminate slice leakage with a theoretical guarantee. We provided a theoretical comparison of SMILE and CAIPIRINHA within the prescribed FOV, and experimentally validated SMILE's superior SER and SSIM with various image reconstruction methods. SMILE+existing parallel imaging reconstruction with appropriately adjusted calibration/ACS data size and k-space kernel sizes delivers high image quality even at high net acceleration rates.

The invention claimed in:

1. A method for simultaneous multislice (SMS) magnetic resonance imaging (MRI) acquisition and image reconstruction comprising:

(a) using an MRI apparatus, simultaneously i) exciting multiple imaging slices with a phase modulation strategy used to distribute image content over an extended phase-encoding field of view (FOV); and ii) acquiring data from the multiple imaging slices using a sampling strategy comprising an arbitrary k-space under-sampling pattern over an extended phase-encoding FOV k-space matrix that is expanded in the phase-encoding dimension relative to a single-slice FOV k-space matrix to encompass multiple respective regions of interest of the multiple imaging slices without mutual overlap in a fully-sampled extended FOV image; and (b) reconstructing images comprising the multiple imaging slices over the extended phase-encoding FOV by transforming the acquisition of the multiple imaging slices into a two-dimensional de-aliasing task using an image reconstruction technique.

2. The method of claim 1 wherein the sampling strategy uses Cartesian variable density and adjustable temporal resolution (CAVA) as a spatial-temporal k-space sampling strategy.

3. The method of claim 1 wherein the sampling strategy uses a uniform under-sampling pattern as a k-space sampling strategy.

4. The method of claim 1 wherein the sampling strategy uses a variable density Poisson disk strategy or other variable density strategy is used as a spatial-temporal sampling strategy.

5. The method of claim 1 wherein excitation phase modulation is used to shift slices uniformly or non-uniformly over an extended FOV.

6. The method of claim 1 wherein an optimized phase modulation is applied to each line of k-space data to maximize a metric over the extended phase-encoding FOV reconstruction.

7. The method of claim 1 wherein the extended phase-encoding FOV is a non-integer multiple of the number of excited slices.

8. The method of claim 1 wherein the image reconstruction technique is high-dimensional fast convolutional framework (HICU) image reconstruction.

9. The method of claim 1 wherein the image reconstruction technique is performed using parallel imaging reconstruction.

10. The method of claim 1 wherein the image reconstruction technique is performed using a compressed-sensing-based reconstruction.

11. The method of claim 1 wherein the image reconstruction technique is performed using a machine-learning-based reconstruction.

12. The method of claim 1 wherein the image reconstruction technique is performed using a low-rank subspace reconstruction.

13. A method for magnetic resonance imaging comprising performing with an MRI apparatus simultaneous multislice (SMS) acquisition and image reconstruction, characterized in that:

(a) the SMS acquisition uses Cartesian sampling with variable density and adjustable temporal resolution (CAVA) spatiotemporal sampling and samples in a superposition of multiple linear-phase-modulated k-space with an extended field of view, thereby avoiding abrupt image content change; and (b) the image reconstruction is high-dimensional fast convolutional framework (HICU) image reconstruction.

* * * * *